US010073353B2

(12) United States Patent
Shiraishi et al.

(10) Patent No.: US 10,073,353 B2
(45) Date of Patent: Sep. 11, 2018

(54) TARGET SUPPLY DEVICE AND EUV LIGHT GENERATION APPARATUS

(71) Applicant: Gigaphoton Inc., Tochigi (JP)

(72) Inventors: Yutaka Shiraishi, Oyama (JP); Hideki Shishiba, Oyama (JP)

(73) Assignee: Gigaphoton Inc., Tochigi (JP)

( * ) Notice: Subject to any disclaimer, the term of this patent is extended or adjusted under 35 U.S.C. 154(b) by 12 days.

(21) Appl. No.: 15/260,625

(22) Filed: Sep. 9, 2016

(65) Prior Publication Data

US 2016/0377986 A1 Dec. 29, 2016

Related U.S. Application Data

(63) Continuation of application No. PCT/JP2015/062304, filed on Apr. 22, 2015.

(30) Foreign Application Priority Data

Apr. 28, 2014 (WO) .................. PCT/JP2014/061839

(51) Int. Cl.
*G03B 27/42* (2006.01)
*G03F 7/20* (2006.01)
(Continued)

(52) U.S. Cl.
CPC ........ *G03F 7/70033* (2013.01); *H01L 21/027* (2013.01); *H05G 2/006* (2013.01); *H05G 2/008* (2013.01)

(58) Field of Classification Search
CPC ...... H01L 21/027; H05G 2/006; H05G 2/005; H05G 2/008; H05G 2/003; G03F 7/70033;
(Continued)

(56) References Cited

U.S. PATENT DOCUMENTS

2010/0213275 A1* 8/2010 Ishihara ................. H05G 2/003
239/102.2
2010/0258747 A1 10/2010 Vaschenko et al.
(Continued)

FOREIGN PATENT DOCUMENTS

JP 03-064479 A 3/1991
JP 09-271652 A 10/1997
(Continued)

OTHER PUBLICATIONS

International Search Report issued in PCT/JP2015/062304; dated Jun. 30, 2015.
(Continued)

*Primary Examiner* — Mesfin Asfaw
(74) *Attorney, Agent, or Firm* — Studebaker & Brackett PC

(57) ABSTRACT

A target supply device may include a tank for storing a target material, a nozzle which is connected to the tank and outputs the target material, and a gas supply section for supplying the tank with gas. The gas supply section may include a booster which is connected to a gas line, boosts the gas supplied from the gas line, and outputs the boosted gas to the tank, a pressure sensor for measuring the pressure inside the tank, and a pressure controller which adjusts the pressure of the gas to be supplied to the tank on the basis of a measurement result from the pressure sensor.

24 Claims, 13 Drawing Sheets

(51) Int. Cl.
*H01L 21/027* (2006.01)
*H05G 2/00* (2006.01)

(58) Field of Classification Search
CPC ....... B05B 17/06; B05B 5/035; B05B 12/082; B05B 5/001
See application file for complete search history.

(56) References Cited

U.S. PATENT DOCUMENTS

2013/0186976 A1* 7/2013 Ishihara .................. B05B 17/06
239/102.1
2013/0221587 A1* 8/2013 Shiraishi .................. C22B 9/00
266/200

FOREIGN PATENT DOCUMENTS

| JP | 2008-193014 A | 8/2008 |
| JP | 2010-166041 A | 7/2010 |
| JP | 2013-175434 A | 9/2013 |
| WO | 2014/024865 A1 | 2/2014 |

OTHER PUBLICATIONS

Written Opinion issued in PCT/JP2015/062304; dated Jun. 30, 2015.

\* cited by examiner

TARGET SUPPLY DEVICE AND EUV LIGHT GENERATION APPARATUS

CROSS-REFERENCE TO RELATED APPLICATION

This is a continuation of International Application No. PCT/JP2015/062304, filed Apr. 22, 2015, which claims the benefit of International Application No. PCT/JP2014/061839, filed Apr. 28, 2014, the entire contents of both of which are incorporated herein by reference.

BACKGROUND

1. Technical Field

The present disclosure relates to a target supply device and an extreme ultraviolet (EUV) light generation apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 45 nm to 70 nm, and further, microfabrication with feature sizes of 32 nm or less will be required. In order to meet the demand for microfabrication with feature sizes of 32 nm or less, for example, an exposure apparatus is needed in which an apparatus for generating extreme ultraviolet (EUV) light at a wavelength of approximately 13 nm is combined with a reduced projection reflective optical system.

Three kinds of apparatuses for generating EUV light are known in general, which include a Laser Produced Plasma (LPP) type apparatus in which plasma generated by irradiating a target material with a laser beam is used, a Discharge Produced Plasma (DPP) type apparatus in which plasma generated by electric discharge is used, and a Synchrotron Radiation (SR) type apparatus using synchrotron radiation.

SUMMARY

A target supply device according to an aspect of the present disclosure, which is configured to supply a target material, may include a tank, a nozzle, and a gas supply section. The tank may be configured to store the target material. The nozzle may be connected to the tank and configured to output the target material. The gas supply section may be configured to supply the tank with gas. The gas supply section may include a booster, a pressure sensor, and a pressure controller. The booster may be connected to the gas line and configured to boost gas supplied from the gas line and supply the tank with the boosted gas. The pressure sensor may be configured to measure pressure inside the tank. The pressure controller may be configured to adjust pressure of the gas to be supplied to the tank based on a measurement result from the pressure sensor.

An EUV light generation apparatus according to an aspect of the present disclosure, which includes a target supply device configured to supply a target material, may irradiate the target material with a laser beam to generate EUV light. The target supply device may include a tank, a nozzle, and a gas supply section. The tank may be configured to store the target material. The nozzle may be connected to the tank and configured to output the target material. The gas supply section may be configured to supply the tank with gas. The gas supply section may include a booster, a pressure sensor, and a pressure controller. The booster may be connected to the gas line and configured to boost gas supplied from the gas line and supply the tank with the boosted gas. The pressure sensor may be configured to measure pressure inside the tank. The pressure controller may be configured to adjust pressure of the gas to be supplied to the tank based on a measurement result from the pressure sensor.

BRIEF DESCRIPTION OF THE DRAWINGS

Hereinafter, selected embodiments of the present disclosure will be described with reference to the accompanying drawings.

DETAILED DESCRIPTION

Figure 1:
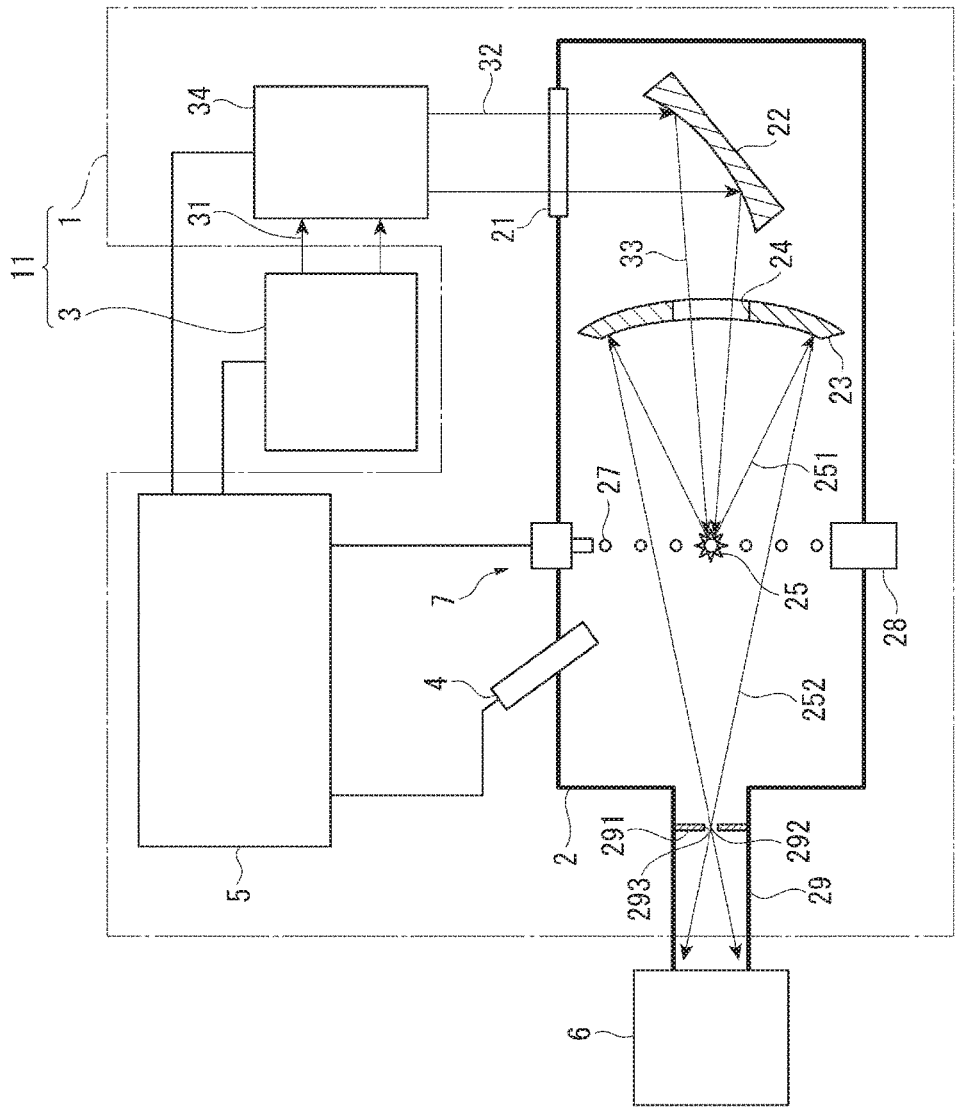
FIG. 1 schematically illustrates a configuration of an LPP type EUV light generation apparatus.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

Contents
1. Overview
2. Overall Description of EUV Light Generation Apparatus
2.1 Configuration
2.2 Operation
3. EUV Light Generation Apparatus Including Target Supply Device
3.1 Terms
3.2 First Embodiment
3.2.1 Overview
3.2.2 Configuration
3.2.3 Operation 3.3 Second Embodiment
3.3.1 Configuration
3.3.2 Operation
3.4 Third Embodiment
3.4.1 Configuration
3.4.2 Operation
3.5 Fourth Embodiment
3.5.1 Configuration
3.5.2 Operation
3.6 Fifth Embodiment
3.6.1 Configuration
3.6.2 Operation
3.7 Sixth Embodiment
3.7.1 Configuration
3.7.2 Operation
3.8 Seventh Embodiment
3.8.1 Configuration
3.8.2 Operation
3.9 Eighth Embodiment
3.9.1 Configuration
3.9.2 Operation
3.10 Variation
1. Overview According to an embodiment of the present disclosure, a target supply device, which is configured to supply a target material, may include a tank, a nozzle, and a gas supply section. The tank may be configured to store the target material. The nozzle may be connected to the tank and configured to output the target material. The gas supply section may be configured to supply the tank with gas. The gas supply section may include a booster, a pressure sensor, and a pressure controller. The booster may be connected to a gas line and configured to boost gas supplied from the gas line and supply the tank with the boosted gas. The pressure sensor may be configured to measure pressure inside the tank. The pressure controller may be configured to adjust pressure of the gas to be supplied to the tank based on a measurement result from the pressure sensor.

According to an embodiment of the present disclosure, an EUV light generation apparatus, which includes a target supply device configured to supply a target material, may irradiate the target material with a laser beam to generate EUV light. The target supply device may include a tank, a nozzle, and a gas supply section. The tank may be configured to store the target material. The nozzle may be connected to the tank and configured to output the target material. The gas supply section may be configured to supply the tank with gas. The gas supply section may include a booster, a pressure sensor, and a pressure controller. The booster may be connected to a gas line and configured to boost gas supplied from the gas line and supply the tank with the boosted gas. The pressure sensor may be configured to measure pressure inside the tank. The pressure controller may be configured to adjust pressure of the gas to be supplied to the tank based on a measurement result from the pressure sensor.

2. Overview Of EUV Light Generation Apparatus
2.1 Configuration

FIG. 1 schematically illustrates an exemplary configuration of an LPP type EUV light generation system. An EUV light generation apparatus 1 may be used with at least one laser apparatus 3. Hereinafter, in the present application, a system that includes the EUV light generation apparatus 1 and the laser apparatus 3 is referred to as an EUV light generation system 11. As shown in FIG. 1 and described in detail below, the EUV light generation apparatus 1 may include a chamber 2 and a target supply device 7. The chamber 2 may be sealed airtight. The target supply device 7 may be mounted onto the chamber 2, for example, to penetrate a wall of the chamber 2. A target material to be supplied by the target supply device 7 may include, but is not limited to, tin, terbium, gadolinium, lithium, xenon, or any combination thereof.

The chamber 2 may have at least one through-hole or opening formed in its wall. The chamber 2 may have a window 21 formed in its wall, through which a pulse laser beam 32 outputted from the laser apparatus 3 may travel into the chamber 2. An EUV collector mirror 23, for example, having a spheroidal reflecting surface may be provided inside the chamber 2. The EUV collector mirror 23 may have a multi-layered reflective film formed on the spheroidal surface thereof. The reflective film may include, for example, a molybdenum layer and a silicon layer, which are alternately laminated. The EUV collector mirror 23 can have a first focus and a second focus, and is preferably positioned such that the first focus lies in a plasma generation region 25 and the second focus lies in an intermediate focus (IF) region 292. The EUV collector mirror 23 may have a through-hole 24 formed at the center thereof so that a pulse laser beam 33 may travel through the through-hole 24.

The EUV light generation apparatus 1 may further include an EUV light generation controller 5, a target sensor 4, and the like. The target sensor 4 may have an imaging function and may be configured to detect the presence, trajectory, position, speed, and the like of a droplet 27 as a target.

Further, the EUV light generation apparatus 1 may include a connection section 29 for allowing the interior of the chamber 2 to be in communication with the interior of the exposure apparatus 6. A wall 291 having an aperture 293 may be provided in the connection section 29. The wall 291 may be positioned such that the second focus of the EUV collector mirror 23 lies in the aperture 293 formed in the wall 291.

The EUV light generation apparatus 1 may also include a laser beam direction control unit 34, a laser beam focusing mirror 22, a target collector 28 for collecting droplets 27, and the like. The laser beam direction control unit 34 may include an optical element for defining the direction into which the pulse laser beam travels and an actuator for adjusting the position and the orientation or posture of the optical element.

2.2 Operation

With continued reference to FIG. 1, a pulse laser beam 31 outputted from the laser apparatus 3 may pass through the laser beam direction control unit 34 and be outputted therefrom as the pulse laser beam 32 so as to travel through the window 21 and enter the chamber 2. The pulse laser beam 32 may travel inside the chamber 2 along at least one laser beam path, be reflected by the laser beam focusing mirror 22, and be irradiated as a pulse laser beam 33 toward at least one droplet 27.

The target supply device 7 may be configured to output the droplet(s) 27 toward the plasma generation region 25 in the chamber 2. The droplet 27 may be irradiated with at least one pulse of the pulse laser beam 33. Upon being irradiated with the pulse laser beam 33, the droplet 27 can be turned into plasma, and rays of reflected light 251 can be emitted from the plasma. The EUV light 252 included in the rays of reflected light 251 may be reflected selectively by the EUV collector mirror 23. The EUV light 252, which is reflected by the EUV collector mirror 23, may travel through the intermediate focus region 292 and be outputted to the exposure apparatus 6. Here, the droplet 27 may be irradiated with multiple pulses included in the pulse laser beam 33.

The EUV light generation controller 5 may be configured to integrally control the EUV light generation system 11. The EUV light generation controller 5 may be configured to process image data of the droplet 27 captured by the target sensor 4. Further, the EUV light generation controller 5 may be configured to control the timing when the droplet 27 is outputted, the direction into which the droplet 27 is outputted, or the like, for example. Furthermore, the EUV light generation controller 5 may be configured to control the timing when the laser apparatus 3 oscillates, the direction in which the pulse laser beam 32 travels, the position at which the pulse laser beam 33 is focused, or the like, for example. The various controls mentioned above are merely examples, and other controls may be added as necessary.

3. EUV Light Generation Apparatus Including Target Supply Device

3.1. Terms

Hereinafter, aside from descriptions that refer to FIG. 1, there are cases where terms regarding directions will be described based on XYZ axes illustrated in the drawings. Further, there are cases where terms regarding directions will be described based on FIG. 3 in descriptions about the configuration and operation of the booster. Note that these expressions do not express relationships with a gravitational direction 10B.

Gas that is boosted by the booster is referred to as "boosted gas" in some cases.

In the descriptions about the configuration and operation hereinbelow, an "upstream side" means a side on which a gas line or a gas bottle is located in a gas flow direction, and a "downstream side" means a side on which a tank is located in the gas flow direction.

3.2 First Embodiment

3.2.1 Overview

In a target supply device or an EUV light generation apparatus according to a first embodiment of the present disclosure, the gas supply section may further include a pressure lowering section configured to lower pressure of gas, which has been boosted by the booster, down to a predetermined pressure.

In the target supply device or the EUV light generation apparatus according to the first embodiment of the present disclosure, the gas supply section may further include a pressure accumulator disposed between the booster and the pressure lowering section.

In the target supply device or the EUV light generation apparatus according to the first embodiment of the present disclosure, the gas supply section may further include a gas purifying section configured to remove impurities from the gas which has been boosted by the booster.

In the target supply device or the EUV light generation apparatus according to the first embodiment of the present disclosure, the gas purifying section may be disposed in a downstream side from the pressure lowering section.

In the target supply device or the EUV light generation apparatus according to the first embodiment of the present disclosure, the gas supply section may further include a particle filter configured to remove particles from the gas which has been boosted by the booster.

In the target supply device or the EUV light generation apparatus according to the first embodiment of the present disclosure, the gas supply section may further include a pressure stabilizer configured to stabilize the pressure of the gas which has been boosted by the booster. In the target supply device or the EUV light generation apparatus according to the first embodiment of the present disclosure, a plurality of the pressure stabilizers may be provided, and one of a plurality of the pressure stabilizers may be the pressure lowering section.

3.2.2 Configuration

Figure 2:
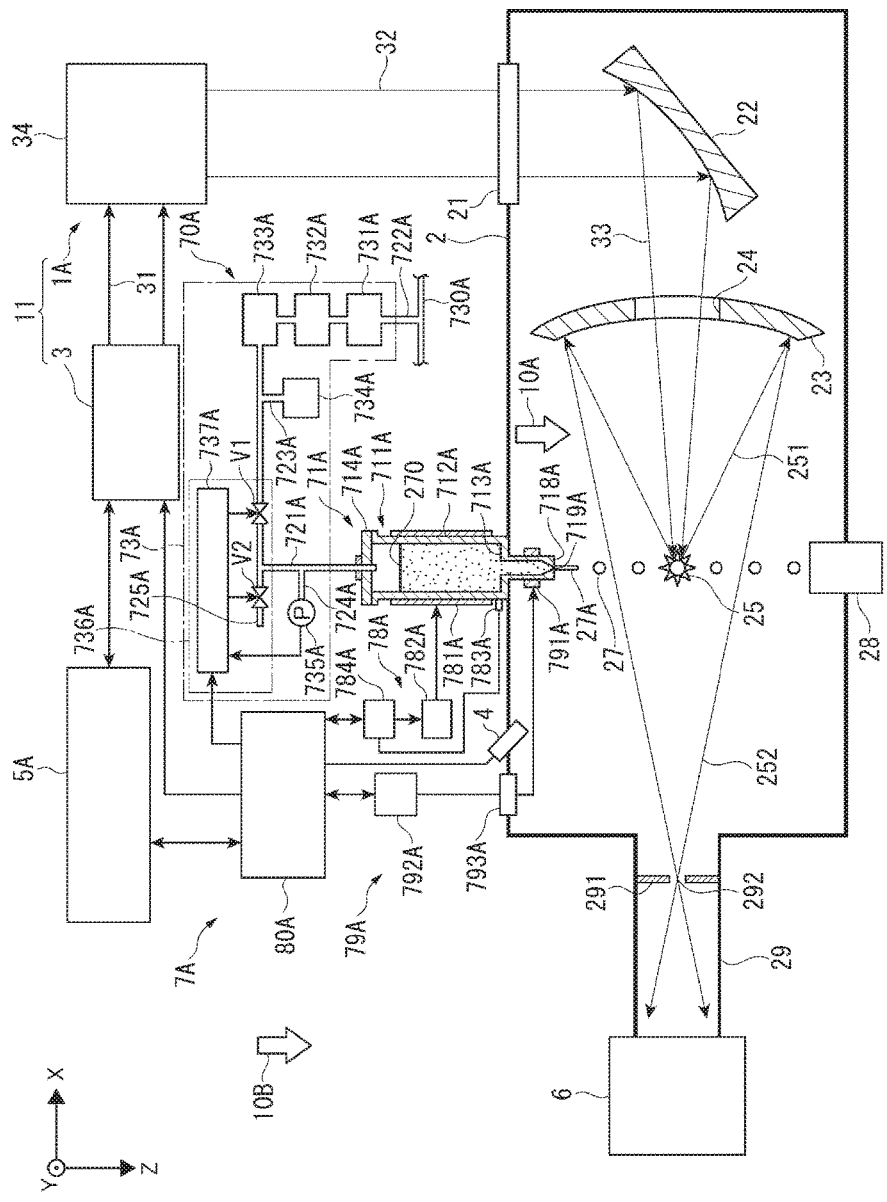
FIG. 2 schematically illustrates a configuration of an EUV light generation apparatus including a target supply device according to a first embodiment.
Figure 3:
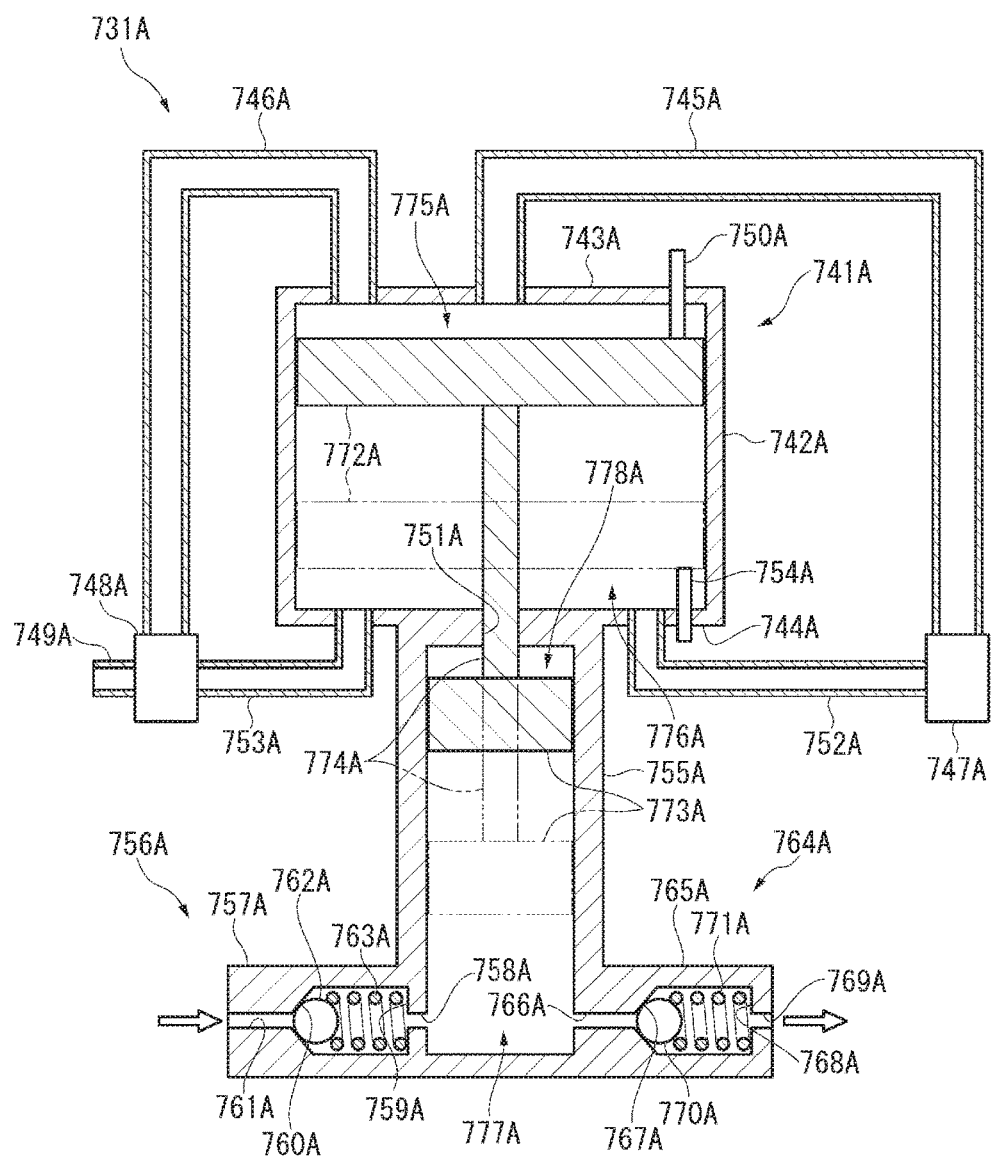
FIG. 3 schematically illustrates a configuration of a booster.

FIG. 2 schematically illustrates a configuration of an EUV light generation apparatus that includes a target supply device according to a first embodiment. FIG. 3 schematically illustrates a configuration of a booster.

An EUV light generation apparatus 1A may, as shown in FIG. 2, include a chamber 2 and a target supply device 7A. The target supply device 7A may include a target generation section 70A and a target control apparatus 80A. A laser apparatus 3, a target sensor 4, and an EUV light generation control system 5A may be electrically connected to a target control apparatus 80A.

As shown in FIG. 2, the target generation section 70A may include a target generator 71A, a gas supply section 73A, a temperature control section 78A, and a piezoelectric section 79A.

The target generator 71A may be formed of molybdenum, for example, which is a material having a low reactivity with the target material 270. The target generator 71A may include a tank 711A for storing the target material 270. The tank 711A may include a main body section 712A, a bottom section 713A, and a lid section 714A.

The main body section 712A may have a cylindrical shape.

The bottom section 713A may be configured to block one end of the main body section 712A on a +Z direction side in an axial direction of the main body section 712A. The bottom section 713A may be integrated with the main body section 712A.

The lid section 714A may be configured to block the other end of the main body section 712A on a −Z direction side in the axial direction of the main body section 712A. The lid section 714A may be configured to be separated from the main body section 712A. The lid section 714A may be fixed to the main body section 712A with use of a bolt (not shown in the drawings). In this case, a space between the main body section 712A and the lid section 714A may be sealed by fitting an O-ring (not shown in the drawings) into a groove formed on a surface of the lid section 714A on the +Z direction side.

A nozzle 718A for outputting the target material 270 within the tank 711A as the droplets 27 to the inside of the chamber 2 may be provided in the tank 711A. The target generator 71A may be provided so that the tank 711A is positioned outside the chamber 2 and the nozzle 718A is positioned inside the chamber 2.

A nozzle hole 719A may be provided to the nozzle 718A. The nozzle hole 719A may have an opening at approximately the center of an end of the nozzle 718A on the +Z direction side. The diameter of the nozzle hole 719A may be in the range of 3 to 15 μm. The nozzle 718A may be formed of a material having a low wettability with the target material 270. Specifically, the material having a low wettability to the target material 270 may be a material whose angle of contact with the target material 270 is greater than 90°. The material having an angle of contact greater than or equal to 90° may be one of SiC, $SiO_2$, $Al_2O_3$, molybdenum, tungsten, and tantalum.

Depending on how the chamber 2 is arranged, it is not necessarily the case that a pre-set output direction for the droplets 27 matches the gravitational direction 10B. The pre-set output direction for the droplets 27 may be set to match a central axis of the nozzle hole 719A, and hereinafter referred to as a set output direction 10A. The configuration may be such that the droplet 27 is outputted horizontally or at an angle relative to the gravitational direction 10B. Incidentally, in the first embodiment, the chamber 2 may be arranged so that the set output direction 10A and the gravitational direction 10B match.

The lid section 714A may be provided with a pipe 721A. The pipe 721A may be configured to penetrate through the lid section 714A so that a first end of the pipe 721A is positioned inside the tank 711A.

The gas supply section 73A may supply the tank 711A with gas through the pipe 721A. The purity of the gas supplied to the tank 711A by the gas supply section 73 may be greater than or equal to 99.999%.

The gas supply section 73A may include a booster 731A, a gas purifying section 732A, a particle filter 733A, a buffer tank 734A as a pressure stabilizer, a pressure sensor 735A, and a pressure controller 736A.

The booster 731A may be an air-driven gas booster manufactured by Haskel International, Inc. (model no.: AGT-7/30, suction gas pressure: 1.0 MPa, discharge gas pressure: 20.7 MPa, flow rate: 0.07 L/min (Normal)), for example.

The booster 731A may be connected to a second end of the pipe 721A. The booster 731A may be connected to a gas line 730A through a pipe 722A. The gas line 730A may be a low-pressure gas line which can be installed in a factory at a moderate price. The gas line 730A may be configured to supply gas at the pressure of approximately 1 MPa. The gas supplied from the gas line 730A may be inert gas such as argon, helium, and nitrogen, or may be hydrogen.

The booster 731A may boost the gas supplied from the gas line 730A, and output the boosted gas to the pipe 721A. As shown in FIG. 3, the booster 731A may include an air barrel 741A. The air barrel 741A may have a box shape. The air barrel 741A may include a cylindrical portion 742A, a first closed portion 743A, and a second closed portion 744A.

The cylindrical portion 742A may have a cylindrical shape.

The first closed portion 743A may close an upper end of the cylindrical portion 742A. A first end of a pipe 745A and a first end of a pipe 746A may be connected to a different position of the first closed portion 743A, respectively. The pipes 745A and 746A may be connected to the air barrel 741A such that the interior of each of the pipes 745A and 746A is in communication with the interior of the air barrel 741A. A drive air supplier 747A may be connected to a second end of the pipe 745A. A spool 748A may be connected to a second end of the pipe 746A. An exhaust pipe 749A may be connected to the spool 748A.

A first pilot valve 750A may be disposed at a position of the first closed portion 743A to which neither the pipe 745A nor the pipe 746A is connected. The first pilot valve 750A may be disposed such that part of the first pilot valve 750A is positioned inside the air barrel 741A.

The second closed portion 744A may close a lower end of the cylindrical portion 742A. A through-hole 751A may be formed at approximately the center of the second closed portion 744A.

A first end of a pipe 752A and a first end of a pipe 753A may be connected to a different position of the second closed portion 744A, respectively. The pipes 752A and 753A may be connected to the air barrel 741A such that the interior of each of the pipes 752A and 753A is in communication with the interior of the air barrel 741A. The drive air supplier 747A may be connected to a second end of the pipe 752A. The spool 748A may be connected to a second end of the pipe 753A.

The second pilot valve 754A may be disposed at a position of the second closed portion 744A to which neither the pipe 752A nor the pipe 753A is connected. The second pilot valve 754A may be disposed such that part of the second pilot valve 754A is positioned inside the air barrel 741A.

Drive air may be supplied to the interior of the air barrel 741A through the pipe 745A or the pipe 752A by the drive air supplier 747A.

Through the pipe 746A or the pipe 753A, the spool 748A may exhaust air inside the air barrel 741A through the exhaust pipe 749A.

A gas barrel 755A may be disposed at the second closed portion 744A of the air barrel 741A so as to extend downward. The gas barrel 755A may be integrated with the air barrel 741A.

The gas barrel 755A may have a cylindrical shape of which lower end is closed. An inner diameter of the gas barrel 755A may be smaller than an inner diameter of the cylindrical portion 742A. The gas barrel 755A may be disposed such that the pipes 752A and 753A, and the second pilot valve 754A are positioned outside the gas barrel 755A. The gas barrel 755A may be disposed such that the center of the through-hole 751A is located at the center of the gas barrel 755A in a radial direction thereof.

A first check valve 756A and a second check valve 764A may be disposed at a different position on a side surface of the gas barrel 755A on the lower-end side, respectively.

The first check valve 756A may have a cylindrical main body section 757A. The main body section 757A may be formed so as to extend to the outside of the gas barrel 755A. A distal end of the main body section 757A may be connected to the gas line 730A through the pipe 722A. The interior of the main body section 757A may be in communication with the interior of the gas barrel 755A through a through-hole 758A formed on the side surface of the gas barrel 755A. An inner diameter of the through-hole 758A may be smaller than an inner diameter of the main body section 757A. Thereby, a ring-shaped spring contact portion 759A can be formed outside the through-hole 758A.

An inclined surface section 760A may be formed at the distal end of the main body section 757A so as to be located inside the main body section 757A. The inclined surface section 760A may have a shape such that a diameter of the inclined surface section 760A is decreased as the distance from the gas barrel 755A is increased. Thereby, a through-hole 761A having an inner diameter smaller than an inner diameter of the main body section 757A can be formed at the distal end of the main body section 757A.

A ball 762A may be disposed inside the main body section 757A. A diameter of the ball 762A may be smaller than the inner diameter of the main body section 757A and larger than the inner diameter of the through-hole 761A.

A spring 763A may be disposed inside the main body section 757A. The spring 763A may be a coil spring. The spring 763A may be disposed such that one end of a spiral of the spring 763A in an axial direction thereof comes into contact with the spring contact portion 759A and the other end thereof comes into contact with the ball 762A.

The second check valve 764A may have the same structure as that of the first check valve 756A. The second check valve 764A may include a main body section 765A, a through-hole 766A, an inclined surface section 767A, a spring contact portion 768A, a through-hole 769A, and a ball 770A.

The main body section 765A may have a cylindrical shape. The distal end of the main body section 765A may be connected to the gas purifying section 732A through the pipe 721A. The interior of the main body section 765A may be in communication with the interior of the gas barrel 755A through a through-hole 766A formed on the side surface of the gas barrel 755A. An inclined surface section 767A may be disposed inside the main body section 765A at a side on which the gas barrel 755A is located. The inclined surface section 767A may have a shape such that a diameter of the inclined surface section 767A is decreased as the distance from the gas barrel 755A is decreased. Thereby, the inner diameter of the through-hole 766A can be smaller than the inner diameter of the main body section 765A.

A ring-shaped spring contact portion 768A may be formed at the distal end of the main body section 765A. An opening of the spring contact portion 768A may be a through-hole 769A having an inner diameter smaller than the inner diameter of the main body section 765A.

A ball 770A, which has a diameter smaller than the inner diameter of the main body section 765A and larger than the inner diameter of the through-hole 766A, may be disposed inside the main body section 765A.

A spring 771A, which is a coil spring, may be disposed inside the main body section 765A. The spring 771A may be disposed such that one end of a spiral of the spring 771A in an axial direction thereof comes into contact with the spring contact portion 768A and the other end thereof comes into contact with the ball 770A.

The booster 731A may include an air piston 772A, a gas piston 773A, and a rod 774A.

The air piston 772A may be formed as a circular plate having an outer diameter that is approximately the same as an inner diameter of the cylindrical portion 742A. The air piston 772A may be disposed inside the cylindrical portion 742A such that a thickness direction of the air piston 772A is parallel to an axial direction of the cylindrical portion 742A. An O-ring (not shown in the drawings) may be fit into a groove formed on an outer circumferential surface of the air piston 772A so as to prevent the drive air supplied to a first space 775A located above the air piston 772A from flowing into a second space 776A located below the air piston 772A.

The gas piston 773A may be formed as a circular plate having an outer diameter that is approximately the same as an inner diameter of the gas barrel 755A. The gas piston 773A may be disposed inside the gas barrel 755A such that a thickness direction of the gas piston 773A is parallel to an axial direction of the gas barrel 755A. An O-ring (not shown in the drawings) may be fit into a groove formed on an outer circumferential surface of the gas piston 773A so as to prevent gas in a third space 777A located below the gas piston 773A from flowing into a fourth space 778A located above the gas piston 773A.

The rod 774A may be formed as a round bar having an outer diameter that is approximately the same as an inner diameter of the through-hole 751A. The rod 774A may be inserted through the through-hole 751A. The air piston 772A may be connected to an upper end of the rod 774A. The gas piston 773A may be connected to a lower end of the rod 774A. An O-ring (not shown in the drawings) may be fit into a groove formed on an inner circumferential surface of the through-hole 751A so as to prevent the drive air in the second space 776A from flowing into the fourth space 778A.

For example, as shown by chain double-dashed lines in FIG. 3, it may be configured that the spool 748A allows the first space 775A to be in communication with the outside of the booster 731A through the pipe 746A and the exhaust pipe 749A and that the second space 776A is sealed airtight, when the air piston 772A is brought in contact with the second pilot valve 754A. The drive air supplier 747A may supply only the second space 776A with the drive air. Thereby, the air in the first space 775A is exhausted at the same time as the air piston 772A and the gas piston 773A moves upward, and the pressure in the third space 777A can be lowered. When the pressure in the third space 777A is lowered, the ball 770A is brought into close contact with the inclined surface section 767A such that the second check valve 764A is closed, and concurrently, the ball 762A moves away from the inclined surface section 760A such that the first check valve 756A is opened, and thereby the gas in the gas line 730A can be filled into the third space 777A.

In the case where the amount of the gas filled into the third space 777A is increased, as shown by solid lines in FIG. 3, the air piston 772A can be brought in contact with the first pilot valve 750A. It may be configured that the spool 748A allows the second space 776A to be in communication with the outside of the booster 731A through the pipe 753A and the exhaust pipe 749A and that the first space 775A is sealed airtight, when the air piston 772A is brought in contact with the first pilot valve 750A. The drive air supplier 747A may stop supplying the second space 776A with the drive air, and may supply only the first space 775A with the drive air. Thereby, the air in the second space 776A can be exhausted, and concurrently the air piston 772A and the gas piston 773A can move downward, and the pressure in the third space 777A can be increased. When the pressure in the third space 777A is increased, the ball 762A is brought into close contact with the inclined surface section 760A such that the first check valve 756A is closed, and concurrently, the ball 770A moves away from the inclined surface section 767A such that the second check valve 764A is opened, and thereby the gas boosted by the gas barrel 755A can be supplied to the gas purifying section 732A.

The gas purifying section 732A may be disposed in the pipe 721A such that the gas purifying section 732A is closer to the tank 711A than the booster 731A is. The gas purifying section 732A may remove impurities in the boosted gas supplied from the booster 731A. The impurities in the boosted gas may be an organic component such as a lubricant mixed into the booster 731A, or oxygen. Thereby, it is possible to prevent generation of a product of a reaction between the target material 270 and the impurities within the tank 711A. As a result, it is possible to prevent the product of a reaction from blocking the nozzle 718A. The gas purifying section 732A may be an adsorption-type gas purifying section or a getter-type gas purifying section.

The particle filter 733A may be disposed in the pipe 721A such that the particle filter 733A is closer to the tank 711A than the gas purifying section 732A is. The particle filter 733A may remove particles in the boosted gas outputted from the booster 731A. The particles in the boosted gas may be generated from a sliding component of the booster 731A. The sliding component which generates the particles may be the O-ring provided to the gas piston 773A, or the gas barrel 755A brought into contact with the O-ring. Thereby, it is possible to prevent the particles from entering the tank 711A and blocking the nozzle 718A. The particle filter 733A may be a clean gas filter having a filtration rating of approximately 0.02 μm. The filter element for the particle filter 733A may be a PTFE membrane or the like.

A pipe 723A may be connected to the pipe 721A such that the pipe 723A is closer to the tank 711A than the particle filter 733A is. A first end of the pipe 723A may be connected to a side surface of the pipe 721A. The buffer tank 734A may be disposed at a second end of the pipe 723A.

The bulk of the buffer tank 734A may be larger than a total volume of all gas flow channels located between the booster 731A and the tank 711A. The buffer tank 734A may decrease pressure fluctuation of the boosted gas which occurs inside the pipe 721A. The booster 731A boosts the gas by vertically moving the gas piston 773A, and therefore the pressure fluctuation of the boosted gas corresponding to a reciprocation cycle of the gas piston 773A may occur. The buffer tank 734A may decrease pressure fluctuation of the boosted gas which has been boosted by the booster 731A. The extent of the pressure fluctuation, which has been decreased by the buffer tank 734A, may be less than 10% of the pressure which has been adjusted by the pressure controller 736A.

A pipe 724A may be connected to the pipe 721A such that the pipe 724A is closer to the tank 711A than the buffer tank 734A is. A first end of the pipe 724A may be connected to the side surface of the pipe 721A. The pressure sensor 735A may be disposed at a second end of the pipe 724A.

The pressure sensor 735A may be electrically connected to a valve controller 737A, to be described later, of the pressure controller 736A. The pressure sensor 735A may measure the pressure inside the pipe 724A and transmit a signal corresponding to the measured pressure to the valve controller 737A. The pressure inside the pipe 724A can be approximately the same as the pressure inside the pipe 721A and the pressure inside the tank 711A. Namely, the pressure sensor 735A can measure the pressure inside the tank 711A.

The pressure controller 736A may adjust the pressure of the boosted gas supplied to the tank 711A based on the measurement result from the pressure sensor 735A. The pressure controller 736A may include a first valve V1, a second valve V2, and the valve controller 737A.

The first valve V1 may be disposed at a segment between a connecting portion between the pipe 721A and the pipe 723A and a connecting portion between the pipe 721A and the pipe 724A.

A pipe 725A may be connected to a segment between the connecting portion between the pipe 721A and the pipe 724A and the connecting portion between the pipe 721A and the first valve V1. A first end of the pipe 725A may be connected to the side surface of the pipe 721A. A second end of the pipe 725A may be opened. The second valve V2 may be disposed in the middle of the pipe 725A.

The pipes 721A, 722A, 723A, 724A, and 725A may be made of stainless steel, for example.

The first valve V1 and the second valve V2 may be any one of a gate valve, a ball valve, a butterfly valve, and the like. The first valve V1 and the second valve V2 may be a valve of the same type or a different type.

The valve controller 737A may be electrically connected to the first valve V1 and the second valve V2. The target control apparatus 80A may transmit a signal regarding the first valve V1 and the second valve V2 to the valve controller 737A. The opening/closing of the first valve V1 and the second valve V2 may be switched independently from each other based on the signal transmitted from the valve controller 737A.

When the first valve V1 is opened, the boosted gas supplied from the gas line 730A can be supplied through the pipe 721A to the inside of the tank 711A of the target generator 71A. In the case where the second valve V2 is closed, it is possible to prevent the boosted gas inside the pipe 721A and the tank 711A from being discharged from the second end of the pipe 725A to the outside of the pipe 725A. Consequently, when the second valve V2 is closed at the same time as the first valve V1 is opened, the pressure inside the tank 711A can be increased up to the pressure which is equivalent to the pressure boosted by the booster 731A. Thereafter, the pressure inside the tank 711A can be maintained at the pressure which is equivalent to the pressure boosted by the booster 731A.

When the first valve V1 is closed, it is possible to prevent the boosted gas from being supplied through the pipe 721A to the inside of the tank 711A. When the second valve V2 is opened, the boosted gas inside the pipe 721A and the tank 711 can be discharged from the second end of the pipe 724A to the outside of the pipe 725A due to the difference between the pressure inside the pipe 721A and the tank 711A and the pressure outside the pipe 721A and the tank 711A. Thereby, when the second valve V2 is opened at the same time as the first valve V1 is closed, the pressure inside the tank 711A can be lowered.

The temperature control section 78A may be configured to control the temperature of the target material 270 within the tank 711A. The temperature control section 78A may include a heater 781A, a heater power source 782A, a temperature sensor 783A, and a temperature controller 784A. The heater 781A may be provided on an outer circumferential surface of the tank 711A. The heater power source 782A may cause the heater 781A to produce heat by supplying power to the heater 781A based on a signal from the temperature controller 784A. As a result, the target material 270 within the tank 711A can be heated via the tank 711A.

The temperature sensor 783A may be provided on the outer circumferential surface of the tank 711A, at the location close to the nozzle 718A, or may be provided within the tank 711A. The temperature sensor 783A may be configured to detect a temperature primarily at a location where the temperature sensor 783A is installed as well as the vicinity thereof in the tank 711A, and to send a signal corresponding to the detected temperature to the temperature controller 784A. The temperature at the location where the temperature sensor 783A is installed and the vicinity thereof can be substantially the same as the temperature of the target material 270 within the tank 711A.

The temperature controller 784A may be configured to output, to the heater power source 782A, a signal for controlling the temperature of the target material 270 at a predetermined temperature, based on a signal from the temperature sensor 783A.

The piezoelectric section 79A may include a piezoelectric element 791A and a power source 792A. The piezoelectric element 791A may be provided on an outer circumferential surface of the nozzle 718A within the chamber 2. Instead of the piezoelectric element 791A, a mechanism capable of applying vibrations to the nozzle 718A at high rate may be provided. The power source 792A may be electrically connected to the piezoelectric element 791A via a feedthrough 793A. The power source 792A may be electrically connected to the target control apparatus 80A.

The target generation section 70A may be configured to generate the droplets 27 by generating a jet 27A by a continuous jet method and vibrating the jet 27A outputted from the nozzle 718A.

3.2.3 Operation

Figure 4:
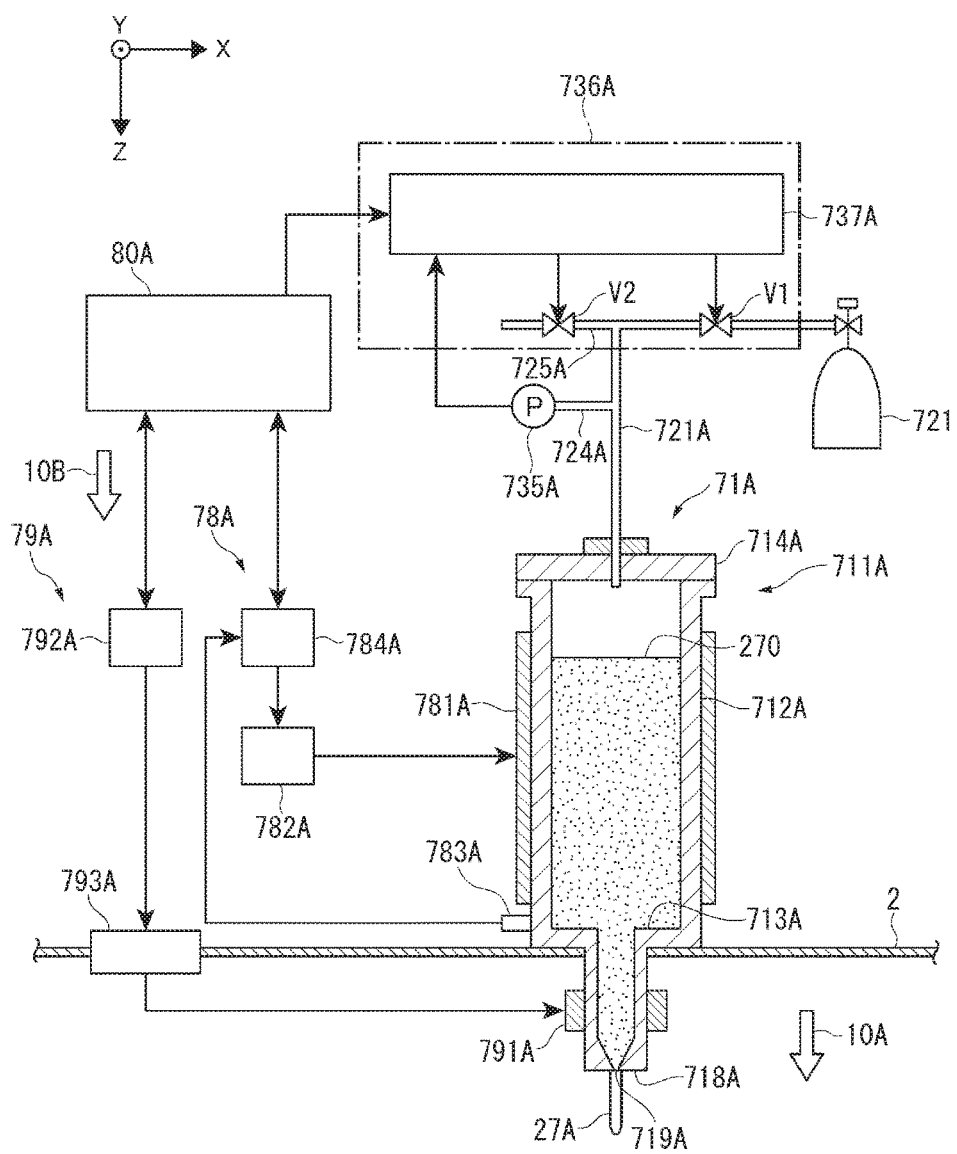
FIG. 4 schematically illustrates a configuration of a target supply device that supplies a tank with gas using a gas bottle.

FIG. 4 schematically illustrates a configuration of a target supply device that supplies a tank with gas using a gas bottle.

Note that the following describes operations performed by the target supply device 7A using a case where the target material 270 is tin as an example.

A target supply device shown in FIG. 4 may have the same configuration as that of the target supply device 7A of the first embodiment except that an inert gas bottle 721 is adopted instead of the booster 731A, the gas purifying section 732A, the particle filter 733A, and the buffer tank 734A.

In such a target supply device, the target control apparatus 80A transmits a signal to the temperature control section 78A so as to heat the target material 270 within the target generator 71A up to a predetermined temperature that is equal to or greater than a melting point of the target material 270.

The target control apparatus 80A may transmit a signal of predetermined frequency to the piezoelectric element 791A. Thereby, the piezoelectric element 791A may vibrate so as to periodically generate the droplet 27 from the jet 27A.

The target control apparatus 80A may transmit a signal to the valve controller 737A such that the pressure inside the tank 711A of the target generator 71A is set to a target pressure Pt. The valve controller 737A may control the opening/closing of the first valve V1 and the second valve V2 such that a value of the difference ΔP between pressure P measured by the pressure sensor 735A and the target pressure Pt becomes smaller. Thereby, the inert gas within the inert gas bottle 721 may be supplied to the inside of the tank 711A, such that the pressure inside the tank 711A is stable at the target pressure Pt. When the pressure inside the tank 711A reaches the target pressure Pt, the jet 27A is outputted from the nozzle 718A, and the droplet 27 can be generated in accordance with the vibration of the nozzle 718A.

In order to improve EUV light output stability, it may be required to increase the interval between the droplets 27. In the case where the interval between the droplets 27 is small, in some cases, influence of plasma for generating the EUV light can disturb a trajectory of the droplet 27 to be irradiated with the laser beam next. In the case where the trajectory of the droplet 27 is disturbed, the laser beam may not be irradiated to an appropriate position of the droplet 27, and as a result, the EUV light output may be fluctuated.

In order to suppress such a phenomenon, the interval between the droplets 27 can be increased, so as to decrease the influence of the plasma for the droplet 27 to be irradiated with the laser beam next. For this purpose, repetition frequency for generating the EUV light can be lowered. However, in order to maintain the EUV light output, it may be necessary to increase the energy of the EUV light. In the case where the energy of the EUV light is increased, it is necessary to improve the laser output, and the cost can be higher.

Accordingly, in order to maintain the repetition frequency of the EUV light output as well as to increase the interval between the droplets 27, the necessity of speeding up the output of the droplet 27 can be increased.

In the case where the droplet 27 is outputted at the speed of approximately 50 m/s, for example, the pressure to be supplied to the tank 711A can be required to be approximately 12 MPa. In contrast, initial fill pressure for the inert gas bottle 721 can be approximately 27 MPa.

The output of the droplets 27 results in gas consumption, and therefore the pressure inside the inert gas bottle 721 can be lowered from the initial fill pressure. When the pressure inside the inert gas bottle 721 falls below the level of the pressure to be supplied to the tank 711A, it becomes impossible for the inert gas bottle 721 to supply the tank 711A with the pressure necessary for outputting the droplet 27, and therefore it can be required to replace the inert gas bottle 721 with another one.

In the case of speeding up the output of the droplet 27, it can be required to increase the pressure to be supplied to the tank 711A. Since the initial fill pressure for the inert gas bottle 721 is limited by the specification of the container of the gas bottle, it can be difficult to readily increase the initial fill pressure for the inert gas bottle 721. Therefore, in the case of speeding up the output of the droplet 27, it can be required to replace the inert gas bottle 721 with another one more frequently.

On the contrary, it is also possible to adopt a method of supplying high-pressure gas for use in the target generation section 70A from a gas facility of a semiconductor factory. However, in order to install a gas facility for supplying gas at several tens of MPa, special pipes, valves, and the like with high pressure resistance are necessary, and therefore the cost can be higher and it can take a lot of man-hours for safety management of the high-pressure gas facility.

In order to improve such a situation, the target supply device 7A may be configured as shown in FIG. 2.

In the target supply device 7A shown in FIG. 2, the booster 731A may boost the gas supplied from the gas line 730A and supply the boosted gas to the pressure controller 736A, when the valve controller 737A of the pressure controller 736A controls the opening/closing of the first valve V1 and the second valve V2, so that the pressure inside the tank 711A reaches the target pressure Pt.

As a preparation for outputting the droplet 27, the third space 777A is filled with the gas supplied from the gas line 730A, the gas piston 773A of the booster 731A moves upward to a position shown by the solid lines in FIG. 3, and the air piston 772A is brought in contact with the first pilot valve 750A. Then, the booster 731A may cause the air piston 772A and the gas piston 773A to move downward. Thereby, at the same time as the first check valve 756A is closed, the second check valve 764A is opened, and the gas inside the third space 777A can be boosted and supplied to the pressure controller 736A. Concurrently, the booster 731A may cause the air piston 772A and the gas piston 773A to move downward such that the flow rate of the boosted gas to be supplied to the pressure controller 736A through the second check valve 764A becomes approximately 2.33 L/min (Normal).

In the case where the gas of approximately 1 MPa is boosted up to approximately 14 MPa and the bulk of a target of which pressure is to be boosted is set to 12 L, it can be assumed that it takes 12 hours to complete the pressure boosting. Regarding the bulk of the target of which pressure is to be boosted, it may be assumed that the bulk of the buffer tank 734A as a typical example is set to 10 L, and the bulk of each of the tank 711A and the pipes 721A, 723A, and 724A is set to 2 L.

Moreover, in some cases, the output of the droplet 27 can be stopped so that the pressure inside the tank 711A becomes about 1 atmosphere (0.1 MPa). In this case, on the assumption that the pressure inside the buffer tank 734A having the bulk of 10 L is maintained at 12 MPa, the bulk of the target of which pressure is to be boosted upon the first boosting can be 2 L. In this case, on the assumption that 12-hour boosting time is ensured until the next output of the droplet 27, the flow rate of the boosted gas to be supplied to the pressure controller 736A may be 0.39 L/min (Normal).

Namely, during the preparation for outputting the droplet 27, the booster 731A may supply the boosted gas of approximately 12 MPa to the pressure controller 736A at the flow rate in the range of 0.35 L/min (Normal) to 2.4 L/min (Normal).

The boosted gas supplied from the booster 731A can be supplied to the gas purifying section 732A. The boosted gas supplied to the gas purifying section 732A, from which impurities are removed by the gas purifying section 732A, can be supplied to the particle filter 733A. The boosted gas supplied to the particle filter 733A, from which particles are removed by the particle filter 733A, can be supplied to the buffer tank 734A and the pressure controller 736A. The pressure fluctuation of the boosted gas supplied to the pressure controller 736A can be decreased in the buffer tank 734A. The pressure controller 736A may adjust the pressure of the boosted gas, of which pressure fluctuation has been decreased, and supply the boosted gas thus adjusted to the inside of the tank 711A. When the pressure inside the tank 711A reaches the target pressure Pt, the jet 27A is outputted from the nozzle 718A, and the droplet 27 can be generated.

In a waiting state in which the pressure inside the tank 711A is maintained at 12 MPa for the purpose of outputting the droplet 27 at any time, the consumed amount of the boosted gas in the pressure controller 736A can be 9.44 cc/min (Normal). The consumed amount of the boosted gas in this case may be an amount of the boosted gas discharged from the pipe 725A upon the second valve V2 of the pressure controller 736A being opened.

Moreover, while the droplet 27 is being outputted, the consumed amount of the boosted gas in the pressure controller 736A can be 12.44 cc/min (Normal). The consumed amount of the boosted gas in the pressure controller 736A may be the sum of the consumed amount of the boosted gas upon the second valve V2 being opened (9.44 cc/min (Normal)) and the consumed amount of the boosted gas upon the droplet 27 being pushed out of the nozzle 718A (3 cc/min (Normal)). The consumed amount of the boosted gas may be supposed on the assumption that the droplet 27, which is tin having a diameter of 20 μm, is outputted by applying the pressure of 12 MPa at the frequency of 100 kHz.

Namely, in the waiting state until the droplet 27 is outputted or while the droplet 27 is being outputted, the booster 731A may supply the boosted gas of approximately 12 MPa to the pressure controller 736A at the flow rate in the range of 9.4 cc/min (Normal) to 12.5 cc/min (Normal).

In accordance with the consumption of the boosted gas as described above, the air piston 772A and the gas piston 773A of the booster 731A can move downward. Thereby, even when the droplet 27 continues to be outputted and the boosted gas is consumed, the pressure inside the tank 711A can be maintained at the target pressure Pt.

When the air piston 772A moves downward to a position shown by the chain double-dashed lines in FIG. 3 and the air piston 772A is brought in contact with the second pilot valve 754A, the booster 731A may move the air piston 772A and the gas piston 773A upward. Thereby, the second check valve 764A is closed so as to stop supplying the boosted gas, and the first check valve 756A is opened so as to supply the gas from the gas line 730A to the inside of the third space 777A. Then, when the air piston 772A moves upward to the position shown by the solid lines in FIG. 3 and comes in contact with the first pilot valve 750A, as described above, the booster 731A may cause the air piston 772A and the gas piston 773A to move downward and restart supplying the pressure controller 736A with the boosted gas.

The period of time from when the booster 731A stops supplying the boosted gas to when the booster 731A restarts supplying the boosted gas may be, even in the case where the droplet 27 continues to be outputted and the boosted gas continues to be consumed during this period of time, a length in which the pressure inside the tank 711A is maintained at the target pressure Pt.

Accordingly, even in the case where the boosted gas is consumed in accordance with the output of the droplets 27, the booster 731A boosts the gas from the gas line 730A and supplies the pressure controller 736A with the boosted gas, and thereby it is possible to continue to supply the tank 711A with the high-pressure boosted gas. As a result, without replacing the inert gas bottle, it is possible to speed up the output of the droplet 27. Further, since the gas from the gas line 730A which can be installed in a factory at a moderate price is boosted and supplied, it is possible to prevent the cost from being higher, and safety management of the high-pressure gas facility can be unnecessary.

Since the buffer tank 734A decreases pressure fluctuation of the boosted gas, it becomes possible to control the pressure with a high degree of accuracy by the pressure controller 736A. As a result, the output stability of the droplet 27, such as the speed for outputting the droplet 27, the interval between the droplets 27, and the angle for outputting the droplet 27, can be improved.

3.3 Second Embodiment 3.3.1 Configuration

Figure 5:
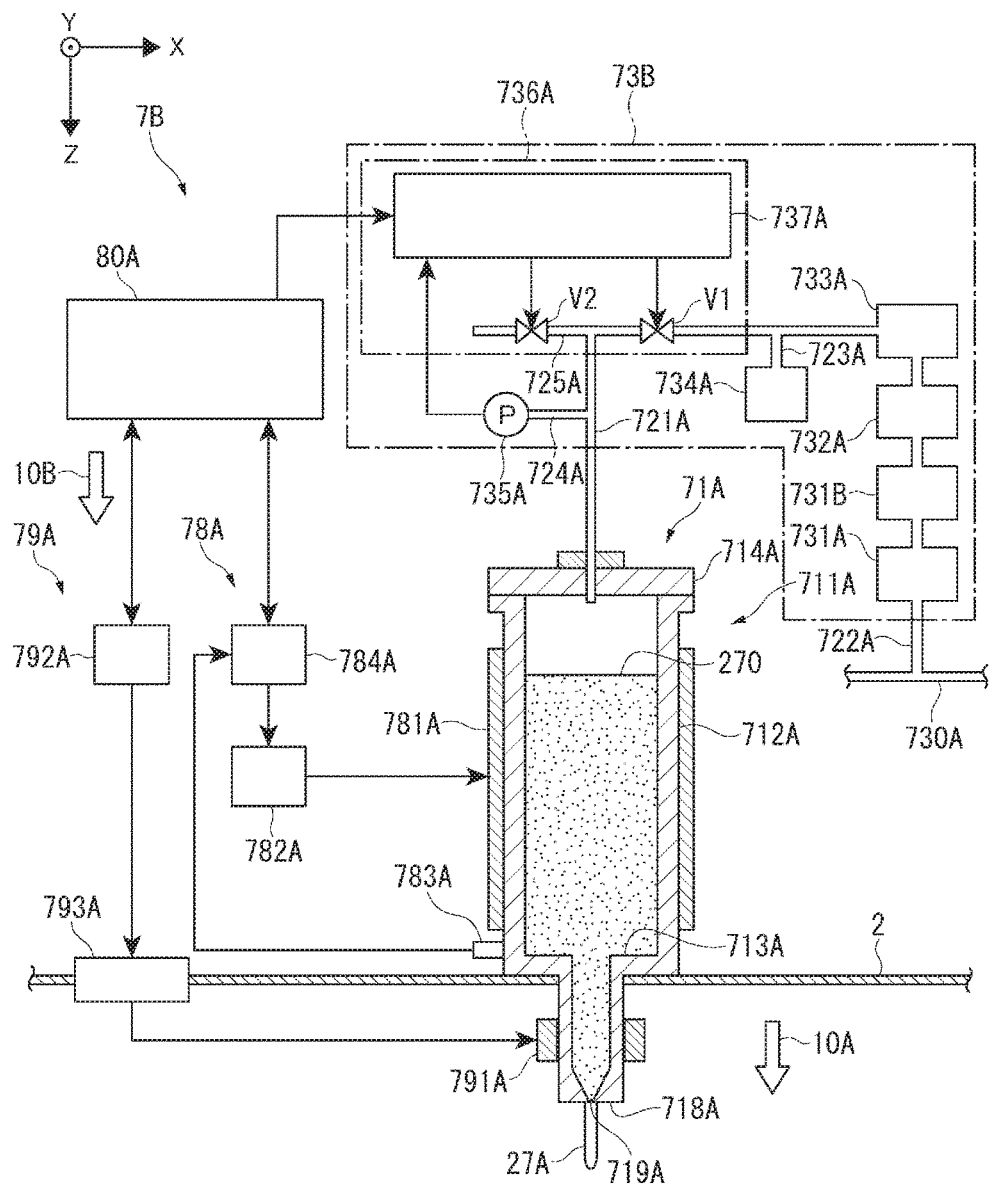
FIG. 5 schematically illustrates a configuration of a target supply device according to a second embodiment.

FIG. 5 schematically illustrates a configuration of a target supply device according to a second embodiment.

A target supply device 7B of the second embodiment may have the same configuration as that of the target supply device 7A of the first embodiment except the provision of a gas supply section 73B.

The gas supply section 73B may have the same configuration as that of the gas supply section 73A of the first embodiment except that the gas supply section 73B further includes a booster 731B which is similar to the booster 731A.

The booster 731B may be disposed at a segment between the booster 731A and the gas purifying section 732A in the pipe 721A.

3.3.2 Operation

Operations performed by the target supply device 7B are described.

Hereinbelow, the description of the operations which are the same as those of the first embodiment will be omitted.

When the pressure controller 736A controls the pressure such that the pressure inside the tank 711A reaches the target pressure Pt in the target supply device 7B, the booster 731A may boost the gas supplied from the gas line 730A and supply the booster 731B with the boosted gas. The booster 731B may further boost the boosted gas from the booster 731A. The boosted gas, which has been boosted by the booster 731B, can be supplied to the pressure controller 736A through the gas purifying section 732A, the particle filter 733A, and the buffer tank 734A.

Thereby, the pressure controller 736A can be supplied with the boosted gas at the pressure higher than that of the first embodiment.

When the pressure inside the tank 711A reaches the target pressure Pt, the jet 27A is outputted from the nozzle 718A, such that the droplet 27 can be generated.

3.4 Third Embodiment 3.4.1 Configuration

Figure 6:
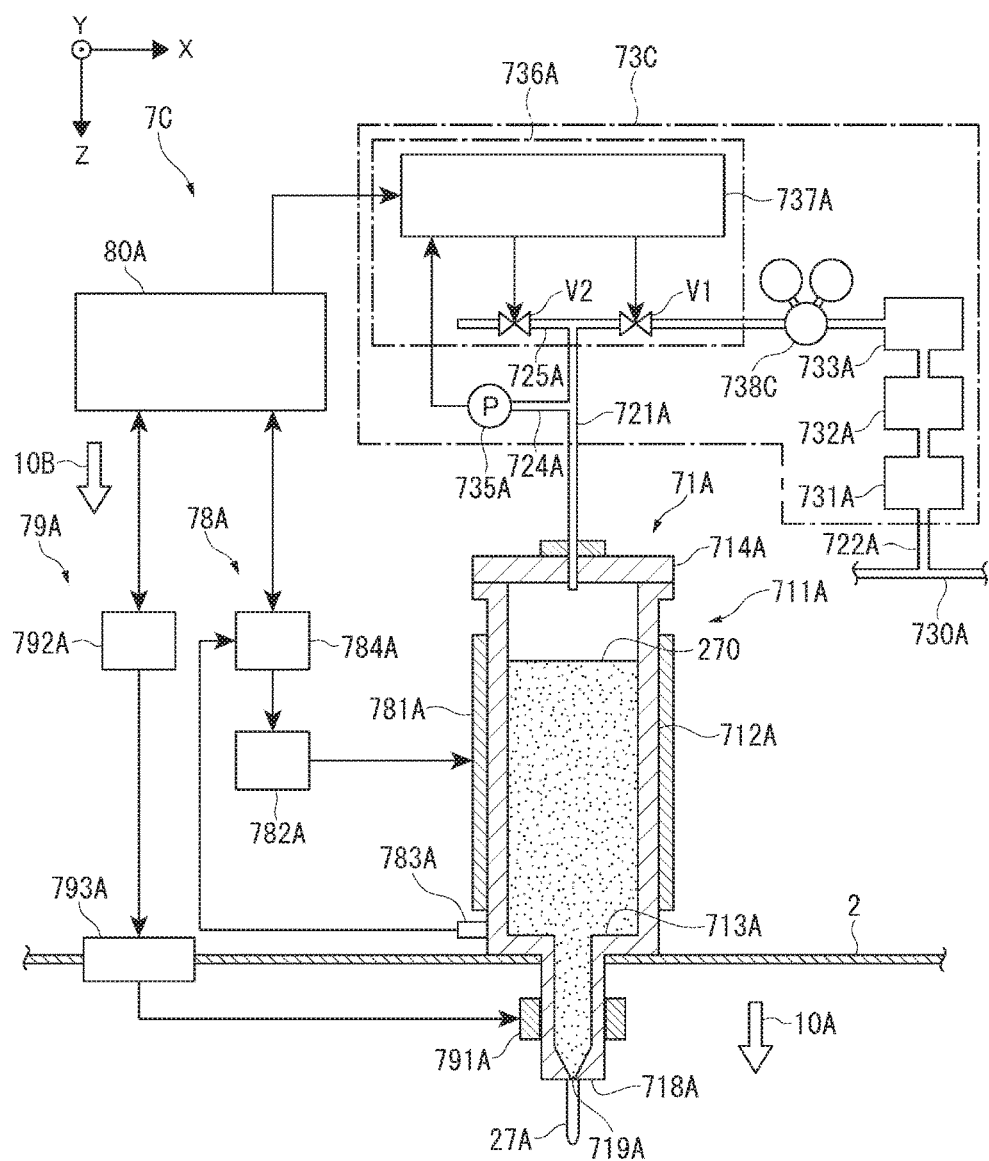
FIG. 6 schematically illustrates a configuration of a target supply device according to a third embodiment.

FIG. 6 schematically illustrates a configuration of a target supply device according to a third embodiment.

A target supply device 7C of the third embodiment may have the same configuration as that of the target supply device 7A of the first embodiment except the provision of a gas supply section 73C.

A gas supply section 73C may have the same configuration as that of the gas supply section 73A of the first embodiment except that a pressure regulator 738C as a pressure stabilizer is provided instead of the buffer tank 734A.

The pressure regulator 738C may be disposed at a segment between the particle filter 733A and the first valve V1 in the pipe 721A. The pipe 723A may not be necessarily connected to the pipe 721A. The material of diaphragm of the pressure regulator 738C may be PTFE (polytetrafluoroethylene), EPM (ethylene-propylene rubber), EPDM (ethylene-propylene-diene rubber), fluoro rubber, or the like. The pressure regulator 738C may decrease the pressure fluctuation which occurs inside the pipe 721A. The extent of pressure fluctuation, which has been decreased by the pressure regulator 738C, may be less than 10% of the pressure which has been adjusted by the pressure controller 736A.

The bulk of the configuration for decreasing the pressure fluctuation can be reduced by using the pressure regulator 738C instead of the buffer tank 734A as described above.

3.4.2 Operation

Operations performed by the target supply device 7C are described.

Hereinbelow, the description of the operations which are the same as those of the first embodiment will be omitted.

When the pressure controller 736A controls the pressure such that the pressure inside the tank 711A reaches the target pressure Pt in the target supply device 7C, the booster 731A may boost the gas supplied from the gas line 730A. The boosted gas, which has been boosted by the booster 731A, can be supplied through the gas purifying section 732A and the particle filter 733A to the pressure regulator 738C. The pressure regulator 738C may decrease the pressure fluctuation of the boosted gas.

Thereby, the pressure controller 736A may be supplied with the boosted gas of which pressure fluctuation has been decreased as with the first embodiment.

When the pressure inside the tank 711A reaches the target pressure Pt, the jet 27A is outputted from the nozzle 718A, such that the droplet 27 is generated.

3.5 Fourth Embodiment 3.5.1 Configuration

Figure 7:
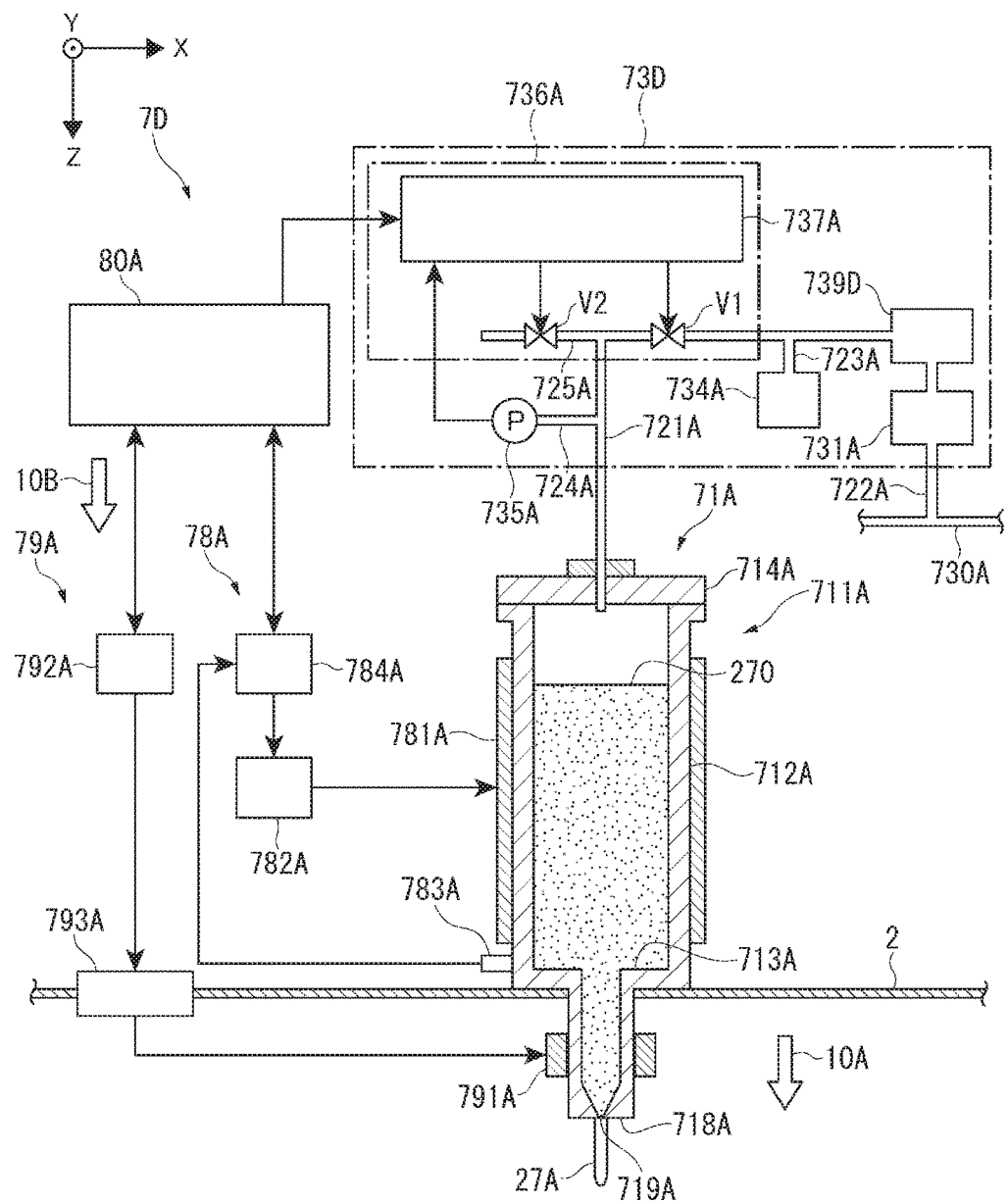
FIG. 7 schematically illustrates a configuration of a target supply device according to a fourth embodiment.

FIG. 7 schematically illustrates a configuration of a target supply device according to a fourth embodiment.

A target supply device 7D of the fourth embodiment may have the same configuration as that of the target supply device 7A of the first embodiment except the provision of a gas supply section 73D.

A gas supply section 73D may have the same configuration as that of the gas supply section 73A of the first embodiment except that a purifier 739D is provided instead of the gas purifying section 732A and the particle filter 733A.

The purifier 739D may be disposed at a segment between a connecting portion between the pipe 721A and the pipe 723A and a connecting portion between the pipe 721A and the booster 731A. The purifier 739D may be a purifier manufactured by SAES Pure Gas, Inc. (model no.: SP70-203, pressure resistance: 206.8 atmospheres (about 21.0 MPa), filtration rating of particle filter: 0.003 µm), for example.

3.5.2 Operation

Operations performed by the target supply device 7D are described.

Hereinbelow, the description of the operations which are the same as those of the first embodiment will be omitted.

When the pressure controller 736A controls the pressure such that the pressure inside the tank 711A reaches the target pressure Pt in the target supply device 7D, the booster 731A may boost the gas supplied from the gas line 730A. The boosted gas, which has been boosted by the booster 731A, can be supplied to the purifier 739D. The purifier 739D may remove the impurities and particles in the boosted gas. The boosted gas, from which the impurities and particles have been removed, can be supplied through the buffer tank 734A and the pressure controller 736A to the tank 711A.

When the pressure inside the tank 711A reaches the target pressure Pt, the jet 27A is outputted from the nozzle 718A, such that the droplet 27 is generated.

3.6 Fifth Embodiment 3.6.1 Configuration

Figure 8:
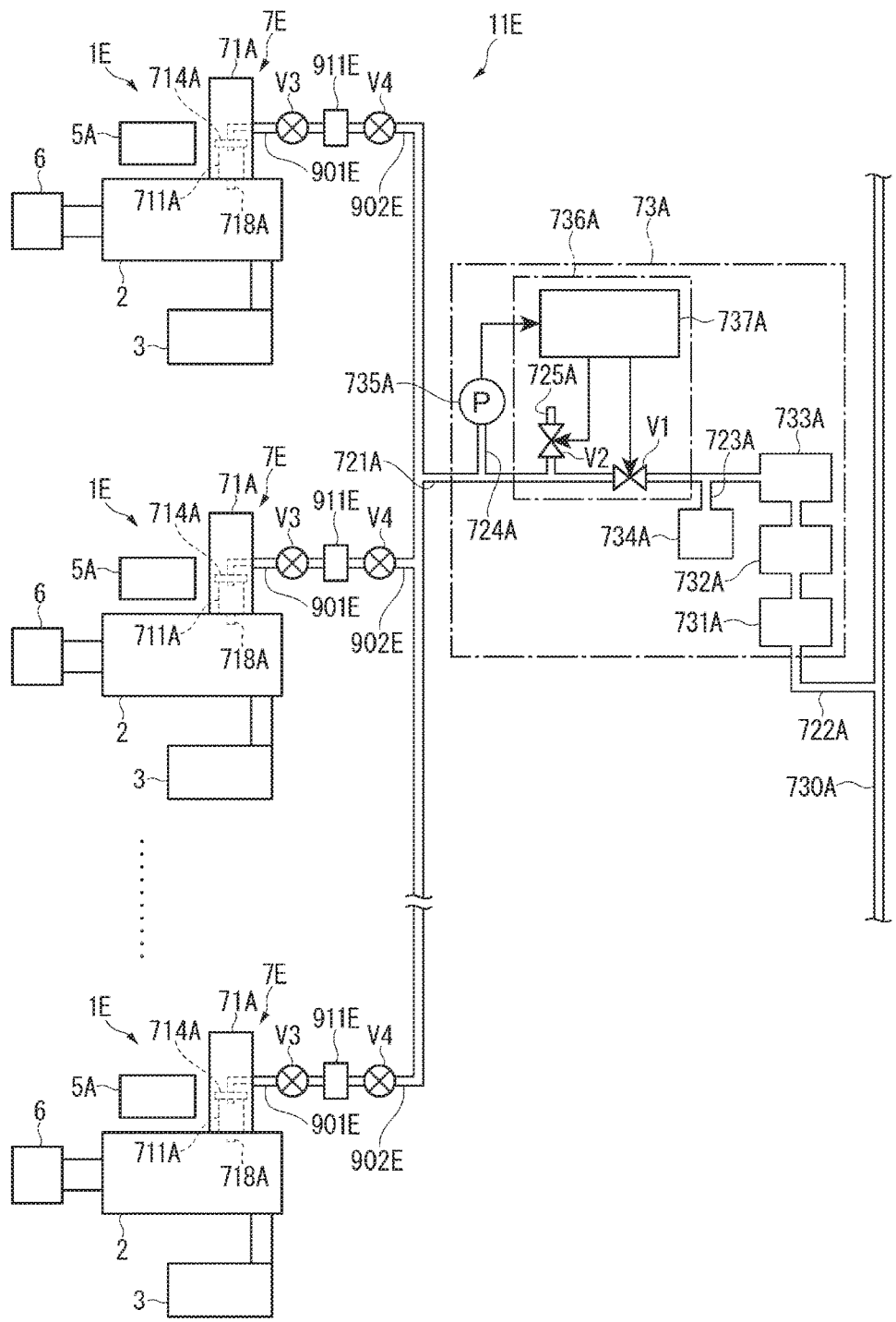
FIG. 8 schematically illustrates a configuration of an EUV light generation system according to a fifth embodiment.

FIG. 8 schematically illustrates a configuration of an EUV light generation system according to a fifth embodiment.

An EUV light generation system 11E of the fifth embodiment may include a plurality of EUV light generation apparatuses 1E and gas supply sections 73A. The number of the gas supply sections 73A is less than that of the EUV light generation apparatuses 1E. Each of the EUV light generation apparatuses 1E may be used together with the laser apparatus 3 and the exposure apparatus 6. The EUV light generation apparatus 1E may have the same configuration as that of the EUV light generation apparatus 1A of the first embodiment except the provision of a target supply device 7E. The target supply device 7E may have the same configuration as that of the target supply device 7A of the first embodiment except that each of the target supply devices 7E is not provided with the gas supply section 73A.

A lid section 714A of the target generator 71A may be provided with a pipe 901E. The pipe 901E may penetrate through the lid section 714A, such that a first end thereof is located inside the tank 711A. A valve V3 may be disposed in the middle of the pipe 901E.

The number of the gas supply sections 73A may be only one, for example.

A pipe 902E may be provided to a first end of the pipe 721A in a state that the pipe 902E is split into the number of the EUV light generation apparatuses 1E. A valve V4 may be respectively connected in the middle of the pipe 902E after being split. A second end of the pipe 902E may be connected to a second end of the pipe 901E through a joint 911E.

Thereby, the boosted gas within the pipe 721A can be supplied to the inside of the tank 711A of each of the plurality of EUV light generation apparatuses 1E. Further, after the valve V3 and the valve V4 are closed, the joint 911E is operated so as to cancel the connection between the pipe 901E and the pipe 902E, and thereby each of the target supply devices 7E can be independently removed to be subjected to maintenance.

3.6.2 Operation

Operations performed by the EUV light generation system 11E are described.

Hereinbelow, the description of the operations which are the same as those of the first embodiment will be omitted.

A worker opens the valve V3 and the valve V4 connected to the EUV light generation apparatus 1E for generating the EUV light among a plurality of the EUV light generation apparatuses 1E constituting the EUV light generation system 11E, so that the boosted gas can be supplied to the tank 711A. Thereafter, in the EUV light generation system 11E, when the pressure controller 736A controls the pressure so that the pressure inside the tank 711A reaches the target pressure Pt, the booster 731A may boost the gas supplied from the gas line 730A. The boosted gas, which has been boosted by the booster 731A, can be supplied to the pressure controller 736A through the gas purifying section 732A, the particle filter 733A, and the buffer tank 734A. The boosted gas of which pressure has been adjusted by the pressure controller 736A can be supplied to the tank 711A of the EUV light generation apparatus 1E whose valve V3 and valve V4 are opened.

When the pressure inside the tank 711A reaches the target pressure Pt, the jet 27A is outputted from the nozzle 718A, such that the droplet 27 is generated.

Thereby, in the case where the extent of decrease in the pressure inside the tank 711A is smaller than a predetermined value when the target supply device 7E outputs the droplet 27 and the flow rate of the boosted gas to be supplied by the gas supply section 73A may be small, it can be sufficient to use only one gas supply section 73A to supply a plurality of the tanks 711A with the boosted gas enough to output the droplets 27. Since the number of the gas supply sections 73A is smaller than that of the tanks 711A, the cost can be lower. Additionally, when the target supply device 7E is independently removed to be subjected to maintenance, it can be unnecessary to stop operations performed by other target supply devices 7E.

3.7 Sixth Embodiment
3.7.1 Configuration

Figure 9:
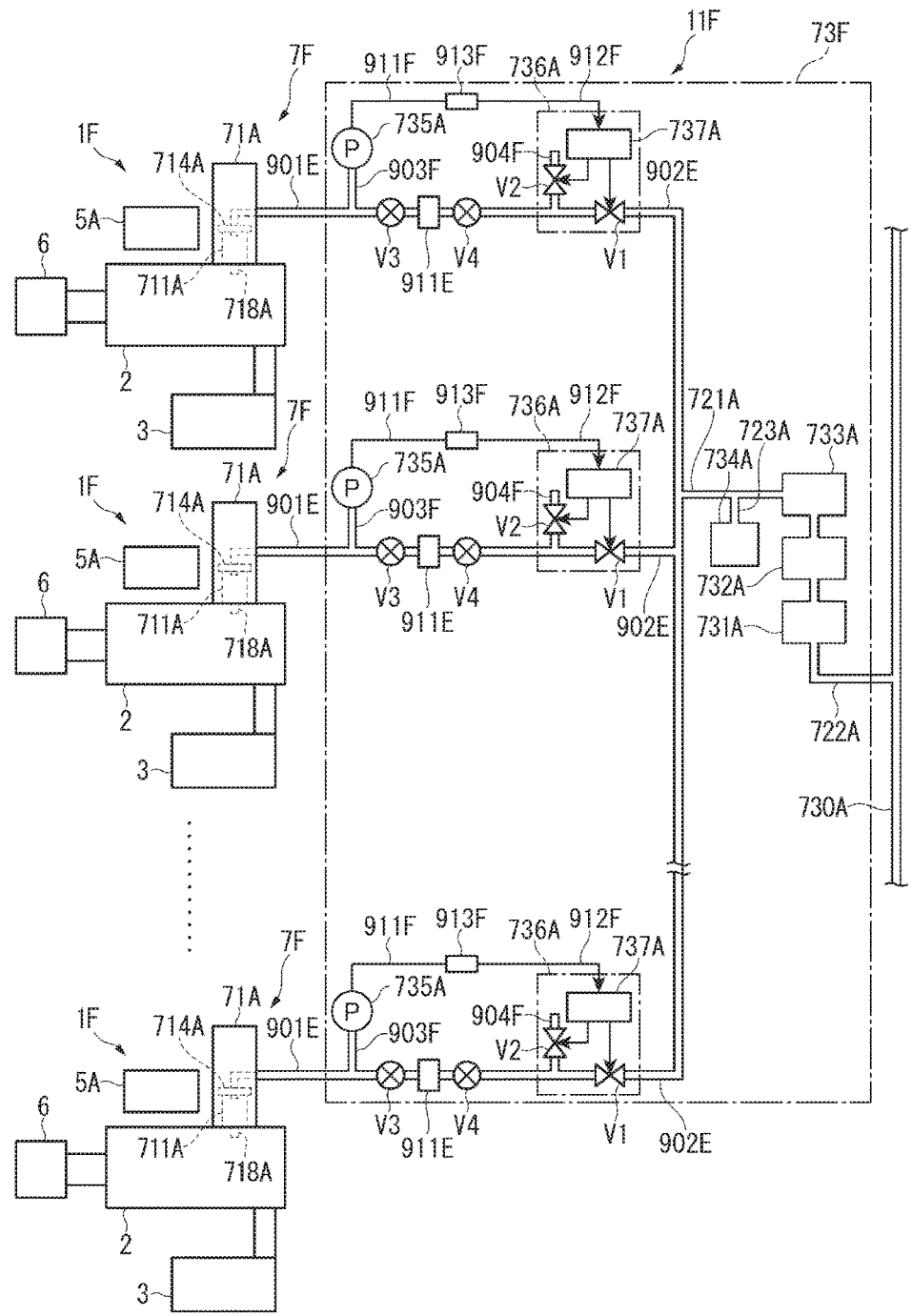
FIG. 9 schematically illustrates a configuration of an EUV light generation system according to a sixth embodiment.

FIG. 9 schematically illustrates a configuration of an EUV light generation system according to a sixth embodiment.

A EUV light generation system 11F of the sixth embodiment may include a plurality of EUV light generation apparatuses 1F and gas supply sections 73F. The number of the gas supply sections 73F is less than that of the EUV light generation apparatuses 1F. Each of the EUV light generation apparatuses 1F may be used together with the laser apparatus 3 and the exposure apparatus 6. The EUV light generation apparatus 1F may have the same configuration as that of the EUV light generation apparatus 1A of the first embodiment except the provision of a target supply device 7F. The target supply device 7F may have the same configuration as that of the target supply device 7A of the first embodiment except that each of the target supply devices 7F is not provided with the gas supply section 73F.

The lid section 714A of the target generator 71A may be provided with a pipe 901E such that a first end of the pipe 901E is located inside the tank 711A. A valve V3 may be disposed in the middle of the pipe 901E.

The number of the gas supply sections 73F may be only one, for example. The gas supply section 73F may include the booster 731A, the gas purifying section 732A, the particle filter 733A, the buffer tank 734A, the pressure sensor 735A, and the pressure controller 736A.

The number of each of the boosters 731A, the gas purifying sections 732A, the particle filters 733A, and the buffer tanks 734A may be one. The number of each of the pressure sensors 735A and the pressure controllers 736A may be the same as that of the EUV light generation apparatuses 1F.

The booster 731A may be connected to a second end of the pipe 721A. The booster 731A may be connected to the gas line 730A through the pipe 722A. The pipe 721A may be provided with the gas purifying section 732A, the particle filter 733A, and the buffer tank 734A, as with the first embodiment.

A pipe 902E may be connected to the first end of the pipe 721A in a state that the pipe 902E is split into the number of the EUV light generation apparatuses 1F. A valve V4 may be respectively connected in the middle of the pipe 902E after being split. The second end of the pipe 902E may be connected to the second end of the pipe 901E through a joint 911E.

A first end of a pipe 903F may be connected to a segment between the valve V3 and the lid section 714A in the pipe 901E. The pressure sensor 735A may be provided to a second end of the pipe 903F.

The first valve V1 of the pressure controller 736A may be provided to a segment between the valve V4 and the pipe 902E after being split at a side on which the pipe 721A is located. A first end of the pipe 904F may be connected to a segment between the first valve V1 and the valve V4 in the pipe 902E. The second valve V2 of the pressure controller 736A may be provided in the middle of the pipe 904F. A second end of the pipe 904F may be opened.

The first valve V1 and the second valve V2 may be electrically connected to the valve controller 737A of the pressure controller 736A. The pressure sensor 735A may be electrically connected to the valve controller 737A with use of an electric wire 911F and an electric wire 912F which are electrically connected to each other through a connector 913F.

Thereby, the boosted gas within the pipe 721A can be supplied to the inside of the tank 711A of each of the plurality of EUV light generation apparatuses 1F. Further, after the valve V3 and the valve V4 are closed, the joint 911E is operated so as to cancel the connection between the pipe 902E and the pipe 901E, at the same time as the connector 913F is operated so as to cancel the connection between the electric wire 911F and the electric wire 912F, and thereby each of the target supply devices 7F can be independently removed to be subjected to maintenance.

3.7.2 Operation

Operations performed by the EUV light generation system 11F are described.

Hereinbelow, the description of the operations which are the same as those of the first embodiment and the fifth embodiment will be omitted.

A worker may open the valve V3 and the valve V4 connected to the EUV light generation apparatus 1F for generating the EUV light among a plurality of the EUV light generation apparatuses 1F constituting the EUV light generation system 11F, so that the boosted gas can be supplied to the tank 711A. Thereafter, the target control apparatus 80A of the EUV light generation apparatus 1F for generating the EUV light may transmit a signal to the valve controller 737A and set the pressure inside the tank 711A to the target pressure Pt. The target pressure Pt of each of the tanks 711A may be the same or different. In the case where the target pressure Pt of each of the tanks 711A is different, a plurality of the target generators 71A each having the nozzle hole 719A with a different diameter may be used so as to output the droplet 27 at the same speed, or a plurality of the target generators 71A each having the nozzle hole 719A with the same diameter may be used so as to output the droplet 27 at a different speed.

In the EUV light generation system 11F, the booster 731A may boost the gas supplied from the gas line 730A such that the pressure inside the tank 711A reaches the target pressure Pt. The boosted gas, of which pressure has been adjusted by the pressure controller 736A, can be supplied to the tank 711A of the EUV light generation apparatus 1F of which valve V3 and valve V4 are opened.

When the pressure inside the tank 711A reaches the target pressure Pt, the jet 27A is outputted from the nozzle 718A, such that the droplet 27 is generated.

Thereby, even in the case where the target pressure Pt of each of the tanks 711A is different, the boosted gas at an appropriate pressure can be supplied to each of the tanks 711A.

3.8 Seventh Embodiment
3.8.1 Configuration

Figure 10:
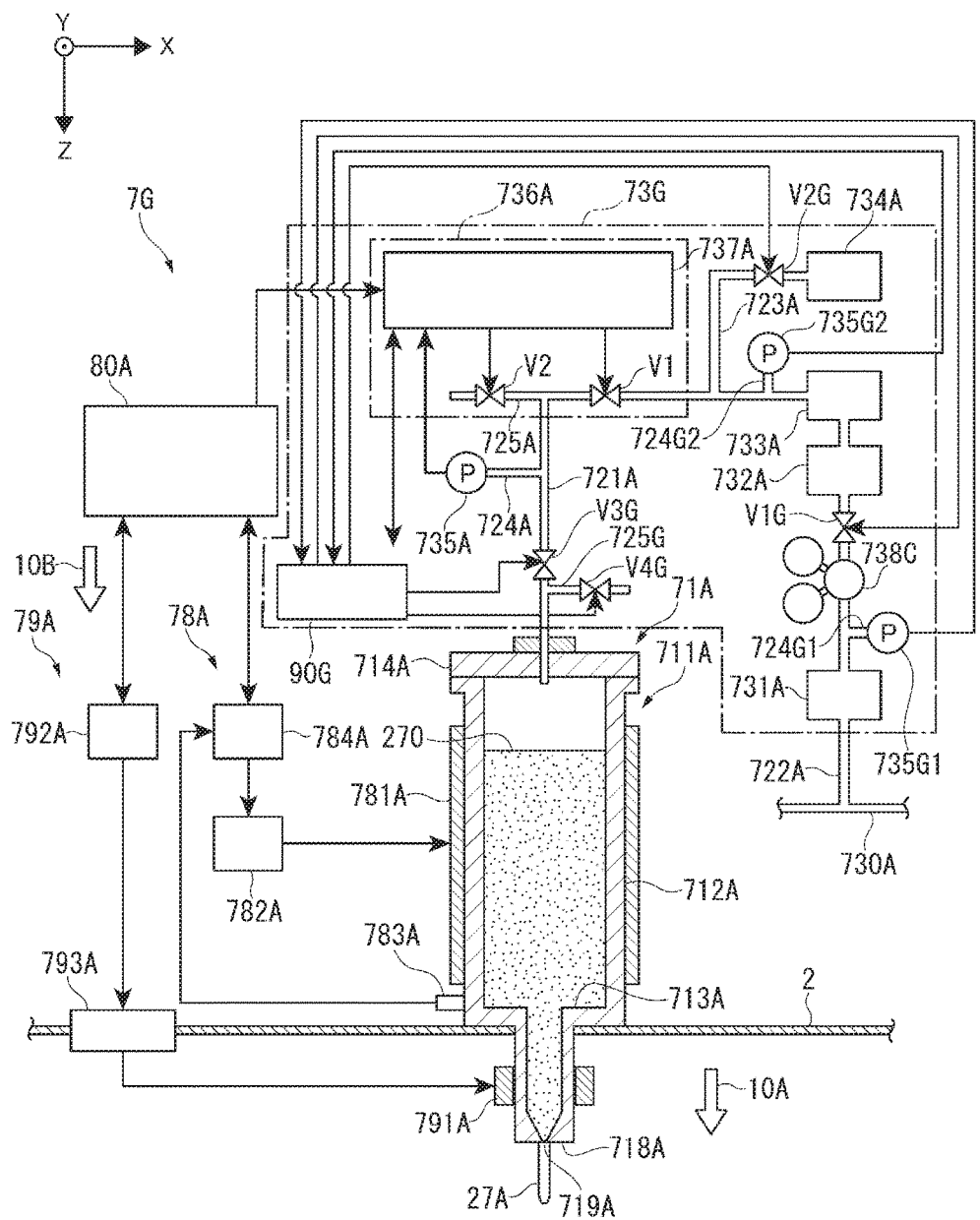
FIG. 10 schematically illustrates a configuration of a target supply device according to a seventh embodiment.

FIG. 10 schematically illustrates a configuration of a target supply device according to a seventh embodiment.

A target supply device 7G of the seventh embodiment may have the same configuration as that of the target supply device 7A of the first embodiment except the provision of a gas supply section 73G.

The gas supply section 73G may have the same configuration as that of the gas supply section 73A of the first embodiment except that the gas supply section 73G is provided with a pressure sensor 735G1, a pressure sensor 735G2, a first line valve V1G, a second line valve V2G, a third line valve V3G, a fourth line valve V4G, and a sequence controller 90G, in addition to the pressure regulator 738C of the third embodiment.

According to this embodiment, the pressure regulator 738C may function as not only the pressure stabilizer but also the pressure lowering section. The pressure of the gas supplied from a gas facility of a semiconductor factory to the gas line 730A may be as low as 0.5 MPa, and the booster 731A may boost the pressure of the gas up to 50 MPa. Then, the pressure regulator 738C as the pressure lowering section lowers the pressure of the gas, which has been boosted by the booster 731A, down to 40 MPa, so as to decrease the pressure fluctuation which occurs due to the operation of the booster 731A. Impurities can be generated from moving elements of the pressure regulator 738C in some cases. Accordingly, in the case where the pressure regulator 738C is disposed at an upstream side from the gas purifying section 732A, the impurities generated in the pressure regulator 738C can be collected by the gas purifying section 732A.

A pipe 724G1 may be connected to a segment between the booster 731A and the pressure regulator 738C in the pipe 721A. A first end of the pipe 724G1 may be connected to the side surface of the pipe 721A. A second end of the pipe 724G1 may be provided with the pressure sensor 735G1.

A pipe 724G2 may be connected to a segment between the particle filter 733A and the pipe 723A in the pipe 721A. A first end of the pipe 724G2 may be connected to the side surface of the pipe 721A. A second end of the pipe 724G2 may be provided with the pressure sensor 735G2.

The pressure sensors 735G1 and 735G2 may be electrically connected to a sequence controller 90G. The pressure sensors 735G1 and 735G2 may respectively measure the pressures inside the pipe 724G1 and the pipe 724G2 and transmit signals corresponding to the measured pressures to the sequence controller 90G.

A first line valve V1G may be disposed at a segment between the pressure regulator 738C and the gas purifying section 732A in the pipe 721A. A second line valve V2G may be disposed in the middle of the pipe 723A. A third line valve V3G may be disposed in the pipe 721A such that the third line valve V3G is closer to the tank 711A than the connecting portion of the pipe 724A is. A pipe 725G may be connected to the pipe 721A such that the pipe 725G is closer to the tank 711A than third line valve V3G is. A first end of the pipe 725G may be connected to the side surface of the pipe 721A. A second end of the pipe 725G may be opened. A fourth line valve V4G may be disposed in the middle of the pipe 725G.

Each of first to fourth line valves V1G, V2G, V3G, and V4G may be an electromagnetically driven valve, or may be any one of a gate valve, a ball valve, a butterfly valve, and the like. Each of the first to fourth line valves V1G, V2G, V3G, and V4G may be a valve of the same type or a different type. The sequence controller 90G may be electrically connected to the first to fourth line valves V1G, V2G, V3G, and V4G.

The sequence controller 90G may determine whether or not an absolute value of the difference in pressure between the pressure P1 measured by the pressure sensor 735G1 and a first target pressure P10 is equal to or less than a first acceptable value ΔP1 and whether or not an absolute value of the difference in pressure between the pressure P2 measured by the pressure sensor 735G2 and a second target pressure P20 is equal to or less than a second acceptable value ΔP2. Then, the sequence controller 90G may control the opening/closing of the first to fourth line valves V1G, V2G, V3G, and V4G based on the result of the determination. Thereby, the gas from the gas line 730A can be supplied to the inside of the tank 711A so that the pressure inside the tank 711A is stable at the target pressure P20. When the pressure inside the tank 711A reaches the target pressure P20, the jet 27A is outputted from the nozzle 718A, and the droplet 27 (see FIG. 1 and FIG. 2) can be generated in accordance with the vibration of the nozzle 718A.

When the first valve V1 and the first and second line valves V1G and V2G are opened, the boosted gas from the gas line 730A can be supplied to the buffer tank 734A and the third line valve V3G above the pipe 721A through the pressure controller 736A. Thereafter, when the third line valve V3G is opened, the boosted gas can be supplied to the inside of the tank 711A of the target generator 71A. In the case where the second valve V2 and the fourth line valve V4G are closed, it is possible to prevent the boosted gas inside the pipe 721A, buffer tank 734A, and tank 711A from being discharged from the second end of the pipe 725A to the outside of the pipe 725A and from the second end of the pipe 725G to the outside of the pipe 725G. Consequently, when the second valve V2 and the fourth line valve V4G are closed at the same time as the first valve V1 and the first, second, and third line valves V1G, V2G, and V3G are opened, the pressure inside the tank 711A can be boosted up to the pressure corresponding to the pressure after being lowered by the pressure regulator 738C. Thereafter, the pressure inside the tank 711A can be maintained at the pressure corresponding to the pressure after being lowered by the pressure regulator 738C.

When the first line valve V1G is closed, it is possible to prevent the boosted gas from being supplied through the pipe 721A to the inside of the tank 711A. When the second valve V2, and the third and fourth line valves V3G and V4G are opened, due to the difference in pressure between the pipe 721A and the outside of the tank 711A, the boosted gas inside the pipe 721A and the tank 711A can be discharged from the second end of the pipe 725A to the outside of the pipe 725A and from the second end of the pipe 725G to the outside of the pipe 725G. Further, when the first valve V1 and the second line valve V2G are closed, and the second valve V2 and the third and fourth line valves V3G and V4G are opened, the pressure inside the tank 711A may be lowered while the gas at a predetermined pressure remains in the buffer tank 734A.

3.8.2 Operation

Figure 11:
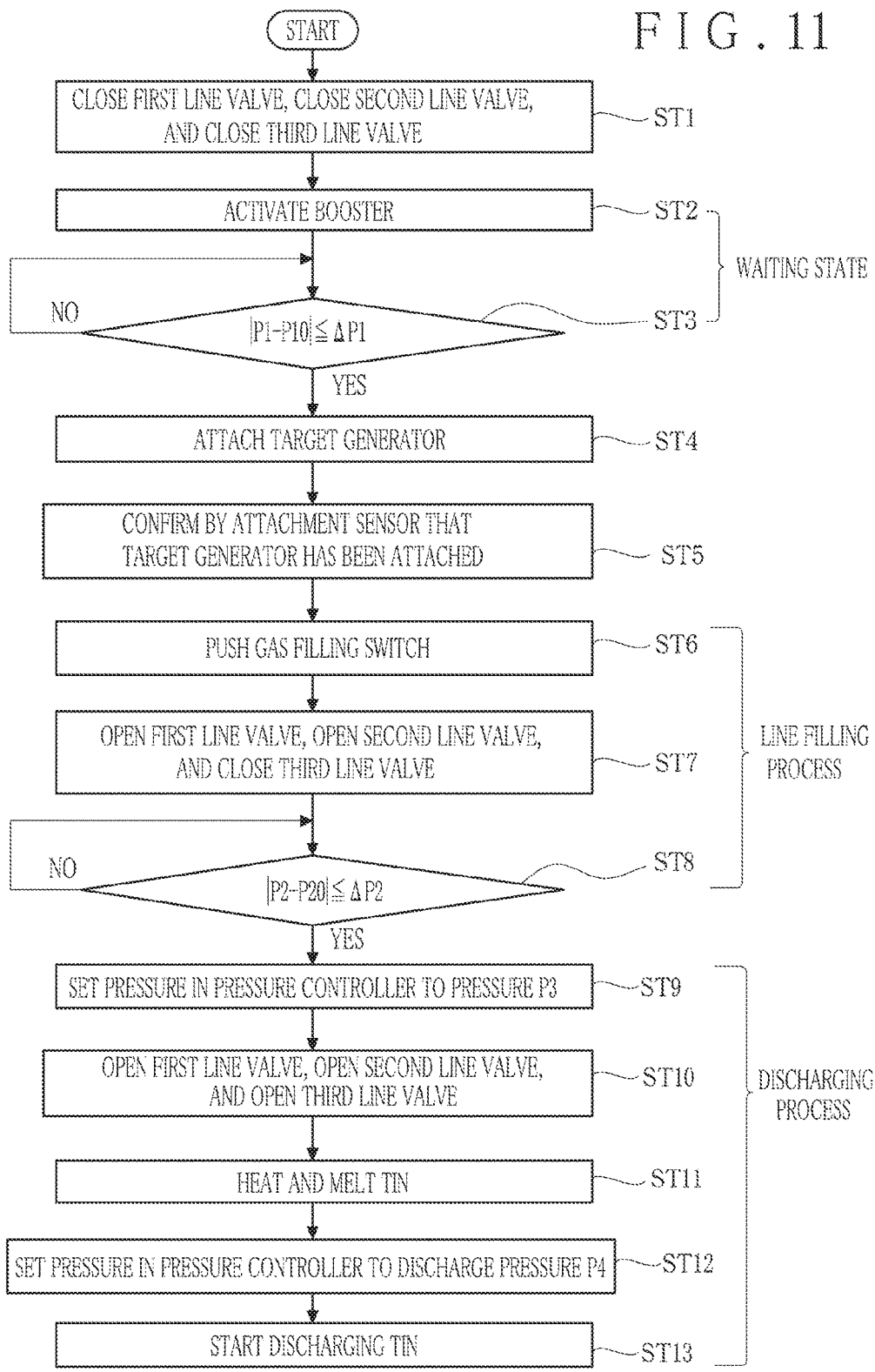
FIG. 11 is a flowchart illustrating operations performed by the target supply device according to the seventh embodiment.

Operations performed by the target supply device 7G are described by referring to the flowchart shown in FIG. 11. Hereinbelow, the description of the operations which are the same as those of the first embodiment will be omitted. Further, the description is based on the assumption that the fourth line valve V4G remains to be in a closed state.

Firstly, in a waiting state before the target generator 71A is attached, the sequence controller 90G may close the first to third line valves V1G, V2G, and V3G (ST1). Next, the sequence controller 90G may activate the booster 731A, such that the pressure in the upstream side from the first line valve V1G becomes closer to a predetermined first target pressure P10 (ST2). Here, the first target pressure P10 may be the pressure to be boosted by the booster 731A, for example, 50 MPa.

The sequence controller 90G may determine whether or not the absolute value of the difference in pressure between the pressure P1 detected by the pressure sensor 735G1 and the first target pressure P10 is equal to or less than a first acceptable value ΔP1 (ST3). The first acceptable value ΔP1 may be, for example, in the range of 0 to 1 MPa. In the case where it is determined that the absolute value of the difference in pressure is equal to or less than the first acceptable value ΔP1, the sequence controller 90G may maintain the waiting state.

Thereafter, the target generator 71A may be attached to the chamber 2 (ST4). An attachment sensor (not shown in the drawings) may detect whether or not the target generator 71A is attached to the chamber 2. The attachment sensor may be, for example, a mechanical limit switch, a magnetic sensor, an optical sensor, or the like.

In the case where it is confirmed that the target generator 71A has been attached (ST5), in a line filling process, a gas filling switch (not shown in the drawings) may be pushed (ST6), such that the gas line 730A is supplied with gas at the pressure of approximately 0.5 MPa. In the case where the gas is always supplied from the gas facility to the gas line 730A, the process ST6 may be omitted. Thereafter, the sequence controller 90G may open the first line valve V1G, so as to boost the gas in the line in the downstream side from the first line valve V1G. At this time, the pressure regulator 738C may lower the pressure down to a level necessary for the tank 711A. The necessary pressure may be in the range of 10 to 90 MPa, for example, 40 MPa.

Next, the sequence controller 90G may open the second line valve V2G, so as to connect the buffer tank 734A to the line (ST7). The buffer tank 734A can decrease the pressure fluctuation, which has not been removed completely by the pressure regulator 738C, so as to make it possible to perform pressure control with a high degree of accuracy by the pressure controller 736A. Then, the sequence controller 90G may determine whether or not the absolute value of the difference in pressure between the pressure P2 detected by the pressure sensor 735G2 and the second target pressure P20 is equal to or less than the second acceptable value ΔP2 (ST8). Here, the second target pressure P20 may be pressure inside the pipe located between the particle filter 733A and the pressure controller 736A, for example, 40 MPa. The second acceptable value ΔP2 may be, for example, in the range of 0 to 1 MPa. In the case where the sequence controller 90G determines that the absolute value of the difference in pressure is equal to or less than the second acceptable value ΔP2, the procedure may proceed to a discharging process.

In the discharging process, the set value of the pressure in the pressure controller 736A may be set to a pressure P3 (ST9). The pressure P3 may be, for example, approximately 0.1 MPa, that is pressure at which the droplet 27 is not discharged. The sequence controller 90G may open the third line valve V3G in a state that the first line valve V1G and the second line valve V2G are opened (ST10). Then, the temperature controller 784A may control the heater power source 782A, such that the heater 781 is heated up to a predetermined temperature which is equal to or greater than a melting point of tin (232° C.) as the target material 270, for example, 280° C., so as to melt the tin (ST11). Thereafter, the pressure controller 736A may change the set value of the pressure to a pressure P4 (ST12). The pressure P4 is a discharge pressure, and may be 40 MPa, for example. As a result, the droplet 27 can be discharged (see FIG. 1 and FIG. 2) (ST13).

Incidentally, in the case where the droplets 27 are discharged at higher speed so as to further increase the interval of the droplets 27, the first target pressure P10 may be set to approximately 100 MPa, the second target pressure P20 may be set to approximately 90 MPa, and the pressure P4 may be set to approximately 90 MPa, for example. In contrast, in the case where the droplets 27 may be discharged at a lower speed, the first target pressure P10 may be set to approximately 10 MPa, the second target pressure P20 may be set to approximately 8 MPa, and the pressure P4 may be set to approximately 8 MPa, for example.

3.9 Eighth Embodiment 3.9.1 Configuration

Figure 12:
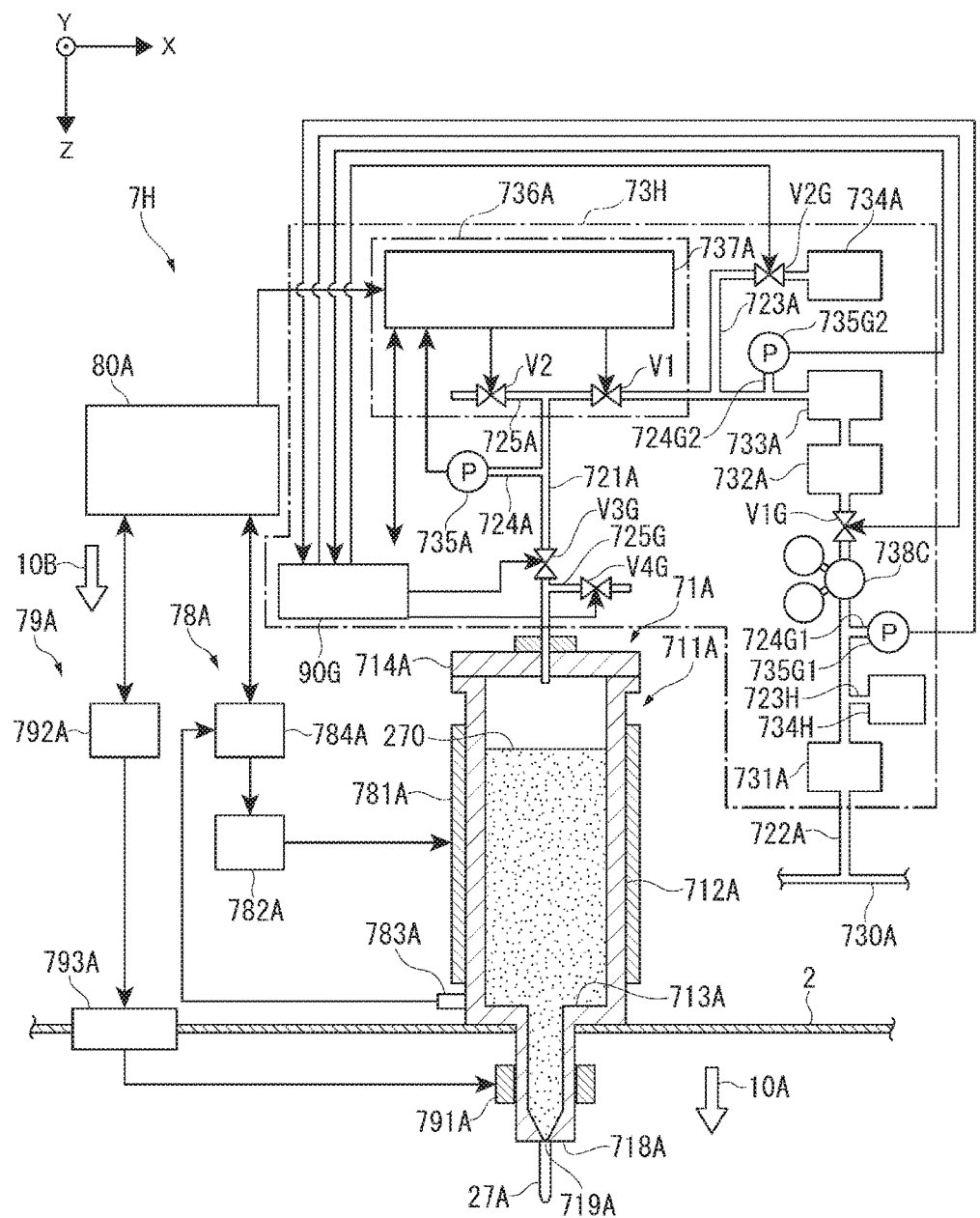
FIG. 12 schematically illustrates a configuration of an EUV light generation system according to an eighth embodiment.

FIG. 12 schematically illustrates a configuration of a target supply device according to an eighth embodiment.

A target supply device 7H of the eighth embodiment may have the same configuration as that of the target supply device 7G of the seventh embodiment except the provision of a gas supply section 73H.

The gas supply section 73H may have the same configuration as that of the gas supply section 73G of the seventh embodiment except that a buffer tank 734H as a pressure accumulator is provided.

A pipe 723H may be connected to a segment between a connecting portion between the pipe 721A and the booster 731A and a connecting portion between the pipe 721A and the pipe 724G1. A first end of the pipe 723H may be connected to the side surface of the pipe 721A. The buffer tank 734H may be provided to a second end of the pipe 723H. Pressure which is higher than the pressure of the gas to be supplied to the tank 711A may be accumulated in the buffer tank 734H. The pressure may be in the range of 15 to 100 MPa, for example.

3.9.2 Operation

Figure 13:
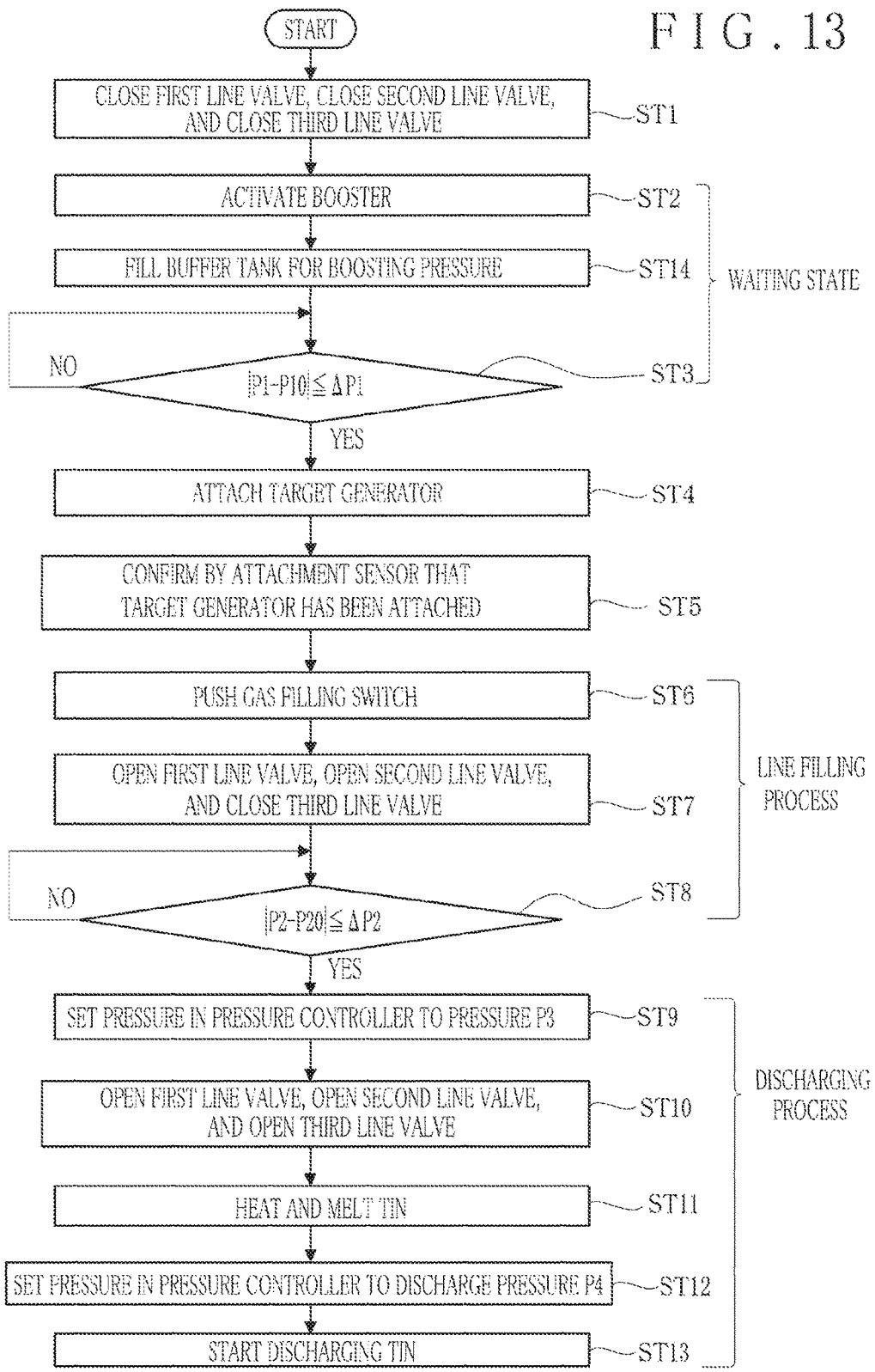
FIG. 13 is a flowchart illustrating operations performed by the target supply device according to the eighth embodiment.

Operations performed by the target supply device 7H are described by referring to the flowchart shown in FIG. 13. Hereinbelow, the description of the operations which are the same as those of the seventh embodiment will be omitted.

During the waiting state in the operation of the target supply device 7H, a process ST14 in which high-pressure gas, which has been boosted by the booster 731A, is filled into the buffer tank 734H may be added between the process ST2 and the process ST3.

In the process ST14, the buffer tank 734H may be filled with gas at pressure higher than the pressure of the gas to be supplied to the tank 711A. In the case where the first target pressure P10 of the gas boosted by the booster 731A is 50 MPa, for example, the buffer tank 734H may be filled with the gas at the pressure of 50 MPa. Since the buffer tank 734H, which has been preliminarily filled with the gas at the pressure (50 MPa) higher than the pressure (40 MPa) of the gas to be supplied to the tank 711A, is prepared, the high-pressure gas can be supplied at a flow rate greater than a generative capacity of the booster 731A in a short period of time, at the time of filling the line in the downstream side from the pressure regulator 738C with the high-pressure gas. The generative capacity of the booster 731A may mean an amount of the gas which can be boosted by the booster 731A per unit time.

3.10 Variation

Incidentally, each of the target supply device and the EUV light generation system may have a configuration as follows.

In the first to sixth embodiments, the booster 731A may be configured to detect the pressure of the third space 777A by the pressure sensor and move the air piston 772A and the gas piston 773A vertically by driving the motor. Hereinbelow, the booster for moving the air piston 772A and the gas piston 773A vertically by the drive air is referred to as a "booster of preferred embodiments", and the booster for moving the air piston 772A and the gas piston 773A vertically by driving the motor is referred to as a "booster of modified examples" in some cases.

In the second embodiment, three or more boosters may be provided. In the first and third to sixth embodiments, two or more boosters may be provided. In the case where two or more boosters are provided, only the boosters of preferred embodiments may be provided, only the boosters of modified examples may be provided, or both of the boosters of preferred embodiments and the boosters of modified examples may be provided.

In the case where the extent of pressure fluctuation of the boosted gas supplied from the booster 731A is less than 10% of the pressure after being adjusted by the pressure controller 736A in the first to sixth embodiments, the buffer tank 734A and the pressure regulator 738C may not be provided. In the first, second, and fourth to sixth embodiments, the pressure regulator 738C may be provided instead of the buffer tank 734A.

In the first to third, fifth, and sixth embodiments, at least one of the gas purifying section 732A and the particle filter 733A may not be provided, and a position at which the gas purifying section 732A is to be disposed may be replaced with a position at which the particle filter 733A is to be disposed. In the first to third, fifth, and sixth embodiments, the purifier 739D may be provided instead of the gas purifying section 732A and the particle filter 733A.

In the fourth embodiment, the purifier 739D may not be provided.

According to the seventh and eighth embodiments, the sequence controller 90G directly reads out the value detected by the pressure sensor 735G1, so as to detect the pressure of the boosted gas, however, the present invention is not limited thereto. For example, in the case where the booster 731A includes a boost controller and a pressure sensor, the boost controller may read out the value detected by the pressure sensor and activate the booster 731A. When the conditions of the process ST3 (see FIG. 11 and FIG. 13) are satisfied, a signal may be outputted to the sequence controller 90G so as to notify the completion of the waiting state.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements."

Further, the modifier "one (a/an)" should be interpreted as "at least one" or "one or more."

What is claimed is:

1. A target supply device configured to supply a target material comprising:
    a tank configured to store the target material;
    a nozzle connected to the tank and configured to output the target material; and
    a gas supply section configured to supply the tank with gas, the gas supply section comprising:
        a pipe having a first end connected to the tank;
        a booster connected between a gas line and a second end of the pipe and configured to boost gas supplied from the gas line and supply the pipe with the boosted gas;
        a pressure sensor configured to measure pressure inside the tank; and
        a pressure controller configured to adjust pressure of the boosted gas in the pipe based on a measurement result from the pressure sensor.

2. The target supply device according to claim 1, wherein the gas supply section further comprises a pressure lowering section configured to lower pressure of the gas, which has been boosted by the booster, down to a predetermined pressure.

3. The target supply device according to claim 2, wherein the gas supply section further comprises a pressure accumulator disposed between the booster and the pressure lowering section.

4. The target supply device according to claim 1, wherein the gas supply section further comprises a gas purifying section configured to remove impurities from the gas which has been boosted by the booster.

5. The target supply device according to claim 4, wherein the gas supply section further comprises a pressure lowering section configured to lower pressure of the gas, which has been boosted by the booster, down to a predetermined pressure.

6. The target supply device according to claim 5, wherein the gas purifying section is disposed in a downstream side from the pressure lowering section.

7. The target supply device according to claim 1, wherein the gas supply section further comprises a particle filter configured to remove particles from the gas which has been boosted by the booster.

8. The target supply device according to claim 7, wherein the gas supply section further comprises a pressure lowering section configured to lower pressure of the gas, which has been boosted by the booster, down to a predetermined pressure.

9. The target supply device according to claim 1, wherein the gas supply section further comprises a pressure stabilizer configured to stabilize the pressure of the gas which has been boosted by the booster.

10. The target supply device according to claim 9, wherein
    the gas supply section further comprises a pressure lowering section configured to lower pressure of the gas, which has been boosted by the booster, down to a predetermined pressure.

11. The target supply device according to claim 10, wherein
    a plurality of the pressure stabilizers are provided, and
    one of the pressure stabilizers is the pressure lowering section.

12. The target supply device according to claim 1, wherein the booster comprises
a barrel having a space therein,
a piston disposed inside the space of the barrel,
a first valve having a first end connected to the barrel and a second end connected to the gas line, and
a second valve having a first end connected to the barrel and a second end connected to the second end of the pipe.

13. The target supply device according to claim 12, wherein
the first valve comprises
a first main body section having a first through-hole formed at the first end of the first valve and a second through-hole formed at the second end of the first valve,
a first ball that contacts the second through-hole, and
a first spring disposed between the first through-hole and the first ball, and
the second valve comprises
a second main body section having a third through-hole formed at the first end of the second valve and a fourth through-hole formed at the second end of the second valve,
a second ball that contacts the third through-hole, and
a second spring disposed between the fourth through-hole and the second ball.

14. An EUV light generation apparatus comprising a target supply device configured to supply a target material, the EUV light generation apparatus irradiating the target material with a laser beam to generate EUV light, the target supply device comprising:
a tank configured to store the target material;
a nozzle connected to the tank and configured to output the target material; and
a gas supply section configured to supply the tank with gas, the gas supply section comprising:
a pipe having a first end connected to the tank;
a booster connected between a gas line and a second end of the pipe and configured to boost gas supplied from the gas line and supply the pipe with the boosted gas;
a pressure sensor configured to measure pressure inside the tank; and
a pressure controller configured to adjust pressure of the boosted gas in the pipe based on a measurement result from the pressure sensor.

15. The EUV light generation apparatus according to claim 14, wherein
the gas supply section further comprises a pressure lowering section configured to lower pressure of the gas, which has been boosted by the booster, down to a predetermined pressure.

16. The EUV light generation apparatus according to claim 15, wherein
the gas supply section further comprises a pressure accumulator disposed between the booster and the pressure lowering section.

17. The EUV light generation apparatus according to claim 14, wherein
the gas supply section further comprises a gas purifying section configured to remove impurities from the gas which has been boosted by the booster.

18. The EUV light generation apparatus according to claim 17, wherein
the gas supply section further comprises a pressure lowering section configured to lower pressure of the gas, which has been boosted by the booster, down to a predetermined pressure.

19. The EUV light generation apparatus according to claim 18, wherein
the gas purifying section is disposed in a downstream side from the pressure lowering section.

20. The EUV light generation apparatus according to claim 14, wherein
the gas supply section further comprises a particle filter configured to remove particles from the gas which has been boosted by the booster.

21. The EUV light generation apparatus according to claim 20, wherein
the gas supply section further comprises a pressure lowering section configured to lower pressure of the gas, which has been boosted by the booster, down to a predetermined pressure.

22. The EUV light generation apparatus according to claim 14, wherein
the gas supply section further comprises a pressure stabilizer configured to stabilize the pressure of the gas which has been boosted by the booster.

23. The EUV light generation apparatus according to claim 22, wherein
the gas supply section further comprises a pressure lowering section configured to lower pressure of the gas, which has been boosted by the booster, down to a predetermined pressure.

24. The EUV light generation apparatus according to claim 23, wherein
a plurality of the pressure stabilizers are provided, and
one of the pressure stabilizers is the pressure lowering section.

* * * * *